(12) United States Patent
Nakayama et al.

(10) Patent No.: US 9,236,223 B2
(45) Date of Patent: Jan. 12, 2016

(54) CHARGED PARTICLE BEAM WRITING APPARATUS, METHOD OF ADJUSTING BEAM INCIDENT ANGLE TO TARGET OBJECT SURFACE, AND CHARGED PARTICLE BEAM WRITING METHOD

(71) Applicant: NuFlare Technology, Inc., Yokohama (JP)

(72) Inventors: Takahito Nakayama, Shizuoka (JP); Takanao Touya, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/155,604

(22) Filed: Jan. 15, 2014

(65) Prior Publication Data
US 2014/0203185 A1 Jul. 24, 2014

(30) Foreign Application Priority Data
Jan. 18, 2013 (JP) ................................. 2013-007682

(51) Int. Cl.
*H01J 37/317* (2006.01)
*H01J 37/04* (2006.01)
(Continued)

(52) U.S. Cl.
CPC ............. *H01J 37/3174* (2013.01); *B82Y 10/00* (2013.01); *B82Y 40/00* (2013.01); *H01J 37/045* (2013.01); *H01J 2237/30461* (2013.01); *H01J 2237/31776* (2013.01)

(58) Field of Classification Search
CPC ... H01J 37/3174; H01J 37/3177; H01J 37/28; H01J 2237/3175; H01J 37/141; H01J 37/3007; H01J 2237/082; H01J 37/045; H01J 37/21; H01J 37/3026; H01J 2237/0492; H01J 2237/12; H01J 2237/1501; H01J 37/12; H01J 37/145
USPC ........... 250/396 R, 398, 400, 396 ML, 491.1, 250/492.2, 492.22, 492.23, 492.3, 505.1
See application file for complete search history.

(56) References Cited

U.S. PATENT DOCUMENTS 3,815,094 A * 6/1974 Smith ............................ 347/121
3,922,546 A * 11/1975 Livesay ........................ 250/310
(Continued)

FOREIGN PATENT DOCUMENTS

JP 01039022 A * 2/1989 ............. H01L 21/30
JP 2000-251827 9/2000
(Continued)

OTHER PUBLICATIONS
U.S. Appl. No. 14/108,936, filed Dec. 17, 2013, Touya, et al.
(Continued)

*Primary Examiner* — Michael Logie
(74) *Attorney, Agent, or Firm* — Oblon, McClelland, Maier & Neustadt, L.L.P.

(57) ABSTRACT

A charged particle beam writing apparatus according to one aspect of the present invention includes an emission unit to emit a charged particle beam, an electron lens to converge the charged particle beam, a blanking deflector, arranged backward of the electron lens with respect to a direction of an optical axis, to deflect the charged particle beam in the case of performing a blanking control of switching between beam-on and beam-off, a blanking aperture member, arranged backward of the blanking deflector with respect to the direction of the optical axis, to block the charged particle beam having been deflected to be in a beam-off state, and a magnet coil, arranged in a center height position of the blanking deflector, to deflect the charged particle beam.

3 Claims, 18 Drawing Sheets

(51) Int. Cl.
  *B82Y 10/00* (2011.01)
  *B82Y 40/00* (2011.01)

(56) References Cited

U.S. PATENT DOCUMENTS

| | | | | |
|---|---|---|---|---|
| 4,145,597 | A * | 3/1979 | Yasuda | 219/121.26 |
| 4,434,371 | A * | 2/1984 | Knauer | 250/396 R |
| 4,835,399 | A * | 5/1989 | Hosaka et al. | 250/492.2 |
| 6,703,630 | B2 * | 3/2004 | Kurokawa | 250/492.22 |
| 7,187,796 | B1 * | 3/2007 | Phan et al. | 382/144 |
| 7,253,417 | B2 * | 8/2007 | Frosien et al. | 250/396 R |
| 8,283,629 | B1 * | 10/2012 | Tuggle et al. | 250/305 |
| 2003/0189180 | A1 * | 10/2003 | Hamaguchi et al. | 250/492.3 |
| 2007/0187624 | A1 * | 8/2007 | Suzuki et al. | 250/492.22 |
| 2008/0149846 | A1 * | 6/2008 | Platzgummer | 250/398 |
| 2009/0180373 | A1 * | 7/2009 | Miyazaki et al. | 369/125 |
| 2009/0206272 | A1 * | 8/2009 | Parker | 250/396 R |
| 2010/0224789 | A1 * | 9/2010 | Sakai et al. | 250/397 |
| 2013/0270435 | A1 * | 10/2013 | Sohda et al. | 250/306 |

FOREIGN PATENT DOCUMENTS

| | | |
|---|---|---|
| JP | 2010-192608 | 9/2010 |
| JP | 2011-228498 | 11/2011 |

OTHER PUBLICATIONS

U.S. Appl. No. 14/108,844, filed Dec. 17, 2013, Touya, et al.
Office Action mailed Mar. 9, 2015 in Taiwanese Application No. 102148472 (w/English translation).
Korean Office Action issued Aug. 14, 2015 in Korean Patent Application No. 10-2014-0006114 with English translation, 12 pages.

* cited by examiner

CHARGED PARTICLE BEAM WRITING APPARATUS, METHOD OF ADJUSTING BEAM INCIDENT ANGLE TO TARGET OBJECT SURFACE, AND CHARGED PARTICLE BEAM WRITING METHOD

CROSS-REFERENCE TO RELATED APPLICATION

This application is based upon and claims the benefit of priority from the prior Japanese Patent Application No. 2013-007682 filed on Jan. 18, 2013 in Japan, the entire contents of which are incorporated herein by reference.

BACKGROUND OF THE INVENTION

1. Field of the Invention

The present invention relates to a charged particle beam writing apparatus, a method of adjusting a beam incident angle to a target object surface, and a charged particle beam writing method. More specifically, for example, the present invention relates to a method of adjusting an incident angle of an electron beam to the target object surface in an electron beam writing apparatus that irradiates electron beams onto the target object while performing a blanking operation.

2. Description of Related Art

The lithography technique that advances miniaturization of semiconductor devices is extremely important as being a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 19 is a conceptual diagram for explaining operations of a variable shaped electron beam writing or "drawing" apparatus. As shown in the figure, the variable shaped electron beam writing apparatus operates as described below. A first aperture 410 has a quadrangular opening 411 for shaping an electron beam 330. A second aperture 420 has a variable-shape opening 421 for shaping the electron beam 330 having passed through the opening 411 of the first aperture 410 into a desired quadrangular shape. The electron beam 330 emitted from a charged particle source 430 and having passed through the opening 411 is deflected by a deflector to pass through a part of the variable-shape opening 421 of the second aperture 420, and thereby to irradiate a target object or "sample" 340 placed on a stage which continuously moves in one predetermined direction (e.g., the x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture 410 and the variable-shape opening 421 of the second aperture 420 is referred to as a variable shaped beam (VSB) system.

For example, in a writing apparatus of the VSB system, one shot beam is formed by a blanking operation. Generally, the writing apparatus has a deflection function for deflecting a plurality of beams, at a subsequent stage of a blanking deflector, and emits a beam to the surface of a target object while deflecting the beam by the beam deflection function (refer to, e.g., Japanese Patent Application Laid-open (JP-A) No. 2000-251827).

Then, in order to increase the position accuracy of writing, it is necessary that the beam incident angle to the target object surface does not change even when a blanking voltage changes during a beam-on period. For example, in the case of not performing a beam deflection other than a blanking operation, it is desirable that a beam incident angle to the target object surface is always perpendicular even when a blanking voltage changes during a beam-on period. If the incident angle deviates from a perpendicular incidence, a positional deviation will occur at the beam irradiation position on the target object surface when defocusing occurs. To solve this problem, it is necessary to measure an incident angle (a landing angle) of a beam in the case of performing deflection of the beam by fine-tuning a blanking voltage of during a beam-on period. However, with respect to voltage used for a blanking operation, generally, binary values of voltage of during a beam-on period and a beam-off period are set in the amplifier that applies a voltage to a blanking deflector in order to secure a blanking speed (response) and voltage stability. For example, a voltage used for a blanking operation is configured by binary values, such as 0V and several V. Since a beam deflected by the voltage of during a beam-off period is blocked by the blanking aperture, it does not reach the target object surface. Therefore, the blanking voltage of during a beam-on period cannot be fine-tuned, and therefore it is difficult to measure a beam incident angle by using the voltage of an existing blanking operation.

BRIEF SUMMARY OF THE INVENTION

In accordance with one aspect of the present invention, a charged particle beam writing apparatus includes an emission unit configured to emit a charged particle beam, an electron lens configured to converge the charged particle beam, a blanking deflector, arranged backward of the electron lens with respect to a direction of an optical axis, configured to deflect the charged particle beam in a case of performing a blanking control of switching between beam-on and beam-off, a blanking aperture member, arranged backward of the blanking deflector with respect to the direction of the optical axis, configured to block the charged particle beam having been deflected to be in a beam-off state, and a magnet coil, arranged in a center height position of the blanking deflector, configured to deflect the charged particle beam.

In accordance with another aspect of the present invention, a charged particle beam writing apparatus includes an emission unit configured to emit a charged particle beam, an electron lens configured to converge the charged particle beam, a blanking deflector, arranged backward of the electron lens with respect to a direction of an optical axis, configured to deflect the charged particle beam in a case of performing a blanking control of switching between beam-on and beam-off, a blanking aperture member, arranged backward of the blanking deflector with respect to the direction of the optical axis, configured to block the charged particle beam having been deflected to be in a beam-off state, and a plurality of magnet coils, arranged backward of the blanking deflector with respect to the direction of the optical axis, configured to deflect the charged particle beam, wherein a magnetic field formed by the plurality of magnet coils is adjusted so that an intersection of the optical axis and an extended line of a trajectory of the charged particle beam deflected by the plurality of magnet coils is located in a center height position of the blanking deflector.

Further, in accordance with another aspect of the present invention, a method of adjusting a beam incident angle to a target object surface includes applying, using a blanking deflector arranged backward of an electron lens with respect to a direction of an optical axis, a voltage for beam-on to the blanking deflector, converging, using the electron lens and a magnet coil arranged in a center height position of the blanking deflector, a charged particle beam by varying a voltage to be applied to the electron lens while supplying, to the magnet coil, a current for a deflection amount smaller than a deflection amount for performing deflection to make a beam-off state by the blanking deflector, and measuring a positional deviation amount of an irradiation position of the charged particle beam irradiating a target object, for each voltage to be applied to the electron lens; determining whether the positional deviation amount is within an allowable value, for the each voltage to be applied to the electron lens; and adjusting the each voltage to be applied to the electron lens so that the positional deviation amount is within the allowable value.

Moreover, in accordance with another aspect of the present invention, a method of adjusting a beam incident angle to a target object surface includes applying, using a blanking deflector arranged backward of an electron lens with respect to a direction of an optical axis, a voltage for beam-on to the blanking deflector, converging, using the electron lens and a plurality of magnet coils arranged backward of the blanking deflector with respect to the direction of the optical axis, a charged particle beam by varying a voltage to be applied to the electron lens while supplying, to the plurality of magnet coils, a current for a deflection amount which is smaller than a deflection amount for performing deflection to make a beam-off state by the blanking deflector, where an intersection of the optical axis and an extended line of a trajectory of the charged particle beam deflected by the plurality of magnet coils is located in a center height position of the blanking deflector, and measuring a positional deviation amount of an irradiation position of the charged particle beam irradiating a target object, for each voltage to be applied to the electron lens; determining whether the positional deviation amount is within an allowable value, for the each voltage to be applied to the electron lens; and adjusting the each voltage to be applied to the electron lens so that the positional deviation amount is within the allowable value.

Moreover, in accordance with another aspect of the present invention, a charged particle beam writing method includes writing a pattern on a target object while performing a blanking operation by the blanking deflector, using a charged particle beam whose incident angle to a surface of the target object has been adjusted by one of the above-described method of adjusting a beam incident angle to the surface of the target object.

Furthermore, in accordance with another aspect of the present invention, a charged particle beam writing apparatus includes an emission unit configured to emit a charged particle beam, an electron lens configured to converge the charged particle beam, a blanking deflector, arranged backward of the electron lens with respect to a direction of an optical axis, configured to deflect the charged particle beam in a case of performing a blanking control of switching between beam-on and beam-off, a blanking aperture member, arranged backward of the blanking deflector with respect to the direction of the optical axis, configured to block the charged particle beam having been deflected to be in a beam-off state, a first amplifier configured to apply a voltage for beam-on and a voltage for beam-off to the blanking deflector, and a second amplifier, connected in parallel with the first amplifier to the blanking deflector, configured to apply, to the blanking deflector, a voltage for deflecting the charged particle beam to be in an extent of deflection not to trigger a beam-off state from a beam-on state by the blanking deflector.

Furthermore, in accordance with another aspect of the present invention, a method of adjusting a beam incident angle to a target object surface includes setting a voltage to be applied to an electron lens for converging a charged particle beam; controlling the charged particle beam to be in a beam-on state by a blanking deflector arranged backward of the electron lens with respect to a direction of an optical axis; measuring an irradiation position of the charged particle beam irradiating a mark arranged at a height position different from a first focus position and a second focus position, in the beam-on state, for each of the first focus position and each of the second focus position adjusted by an objective lens arranged at a subsequent stage of the blanking deflector, and moving a center of the charged particle beam to a side of a center of the objective lens so that a measured positional deviation amount between the irradiation positions becomes less than or equal to a first threshold value, by using a magnet coil arranged between the blanking deflector and the objective lens; deflecting the charged particle beam to be in an extent of deflection not to trigger a beam-off state from the beam-on state by the blanking deflector, treating a center height position of the blanking deflector as a deflection fulcrum; measuring, in a state of the charged particle beam having been deflected, the irradiation position of the charged particle beam irradiating the mark, for the each of the first focus position and the each of the second focus position adjusted by the objective lens, and moving the center of the charged particle beam to the side of the center of the objective lens by using the magnet coil so that a measured positional deviation amount between the irradiation positions becomes less than or equal to the first threshold value; determining whether a difference between a movement amount of the center of the charged particle beam in the beam-on state and a movement amount of the center of the charged particle beam in a deflected state is less than or equal to a second threshold value; and repeating each step while varying the voltage to be applied to the electron lens until the difference becomes smaller than the second threshold value.

DETAILED DESCRIPTION OF THE INVENTION

In the following embodiments, there will be described a configuration in which an electron beam is used as an example of a charged particle beam. However, the charged particle beam is not limited to the electron beam, and other charged particle beam such as an ion beam may also be used. Moreover, a variable shaped beam type writing apparatus will be described as an example of a charged particle beam apparatus.

In the following embodiments, there will be described an apparatus and method that enables a beam incident angle to the target object surface not to change even when a blanking voltage changes during a beam-on period.

First Embodiment

Figure 1:
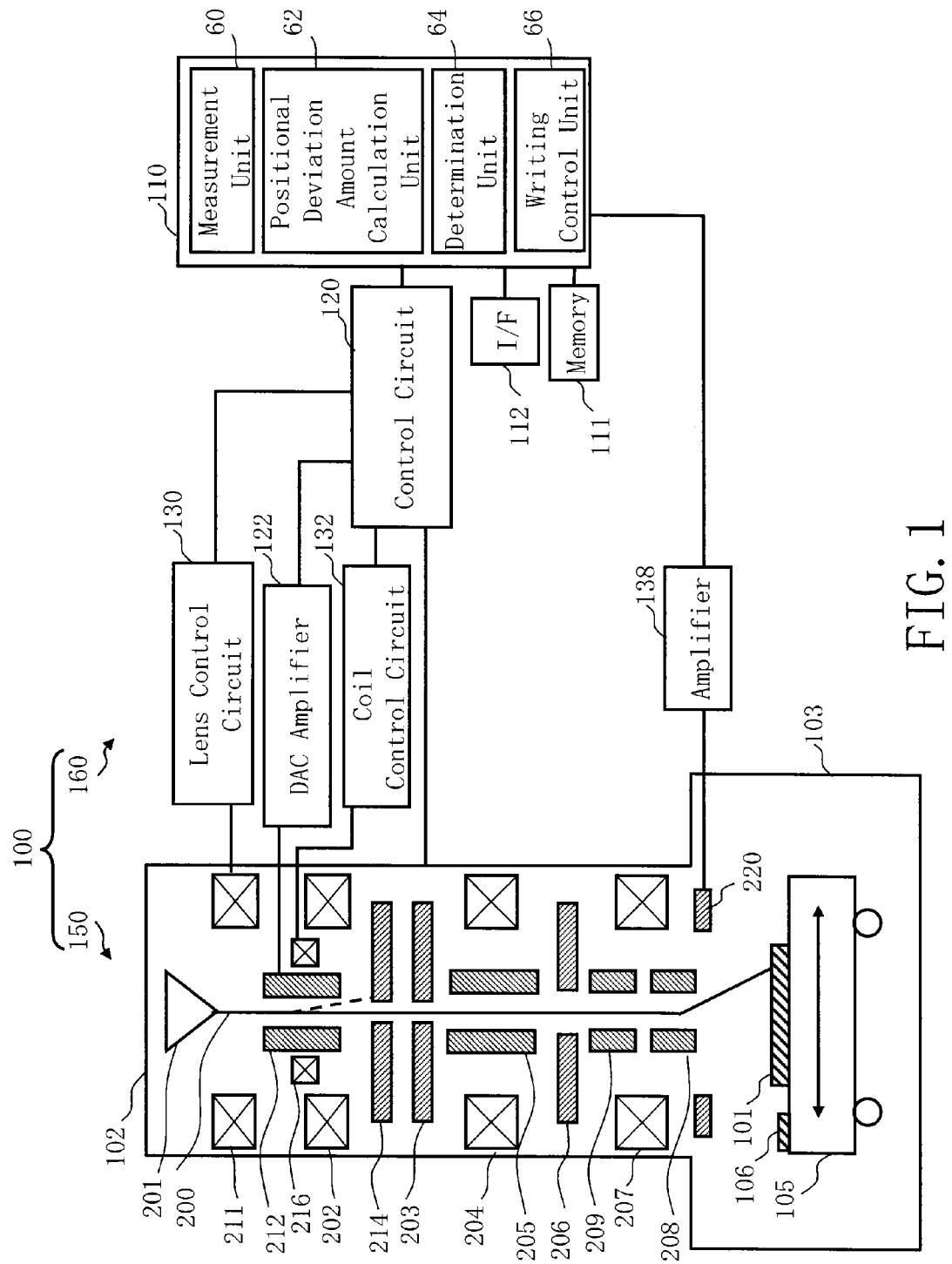
FIG. 1 is a conceptual diagram showing a configuration of a writing apparatus according to the first embodiment.

FIG. 1 is a conceptual diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, it is an example of a variable shaped beam (VSB) type writing apparatus. The writing unit 150 includes an electron lens barrel 102 and a writing chamber 103. In the electron lens barrel 102, there are arranged an electron gun assembly 201, an electron lens 211, an illumination lens 202, a blanking deflector 212, a magnet coil 216, a blanking aperture 214, a first aperture 203, a projection lens 204, a deflector 205, a second aperture 206, an objective lens 207, a main deflector 208, a sub deflector 209 and a detection device 220. In the writing chamber 103, there is arranged an XY stage 105, on which a target object or "sample" 101 such as a mask serving as a writing target is placed when performing writing. The target object 101 is, for example, an exposure mask used for manufacturing semiconductor devices. The target object 101 may be, for example, a mask blank on which resist is applied and a pattern has not yet been formed. A mark 106 is formed at a position, different from the position where the target object 101 is arranged, on the surface of the XY stage 105. It is preferable for the mark 106 to have the shape of a cross, for example. It is preferable for the magnet coil 216 to be placed in the center height position of the blanking deflector 212. A pair of electrodes, for example, is used as the blanking deflector 212.

The control unit 160 includes a control computer 110, a memory 111, an external interface (I/F) circuit 112, a control circuit 120, a DAC (digital analog converter) amplifier 122, a lens control circuit 130, a coil control circuit 132, and an amplifier 138. The control computer 110, the memory 111, the external interface (I/F) circuit 112, the control circuit 120, the lens control circuit 130, the coil control circuit 132, and the amplifier 138 are mutually connected through a bus (not shown).

In the control computer 110, there are arranged a measurement unit 60, a positional deviation amount calculation unit 62, a determination unit 64, and a writing control unit 66. Each function, such as the measurement unit 60, the positional deviation amount calculation unit 62, the determination unit 64, and the writing control unit 66 may be configured by hardware such as an electronic circuit or by software such as a program causing a computer to implement these functions. Alternatively, it may be configured by a combination of hardware and software. Data which is input and output to/from the measurement unit 60, the positional deviation amount calculation unit 62, the determination unit 64, and the writing control unit 66 and data being calculated are stored in the memory 112 each time.

FIG. 1 shows a configuration necessary for explaining the first embodiment. Other configuration elements generally necessary for the writing apparatus 100 may also be included. For example, a multi-stage deflector of two stages of the main deflector 208 and the sub deflector 209 is used for position deflection in this case, but a single stage deflector or a multiple stage deflector of three or more stages may also be used. Input devices, such as a mouse and a keyboard, and a monitoring device, etc. may also be connected to the writing apparatus 100. Moreover, although the blanking aperture 214 is arranged upper than the first aperture 203 in the example of FIG. 1, it is not limited thereto. Any position is acceptable as long as a blanking operation can be performed. For example, it may be arranged lower than the first aperture 203 or the second aperture 206.

Figure 2:
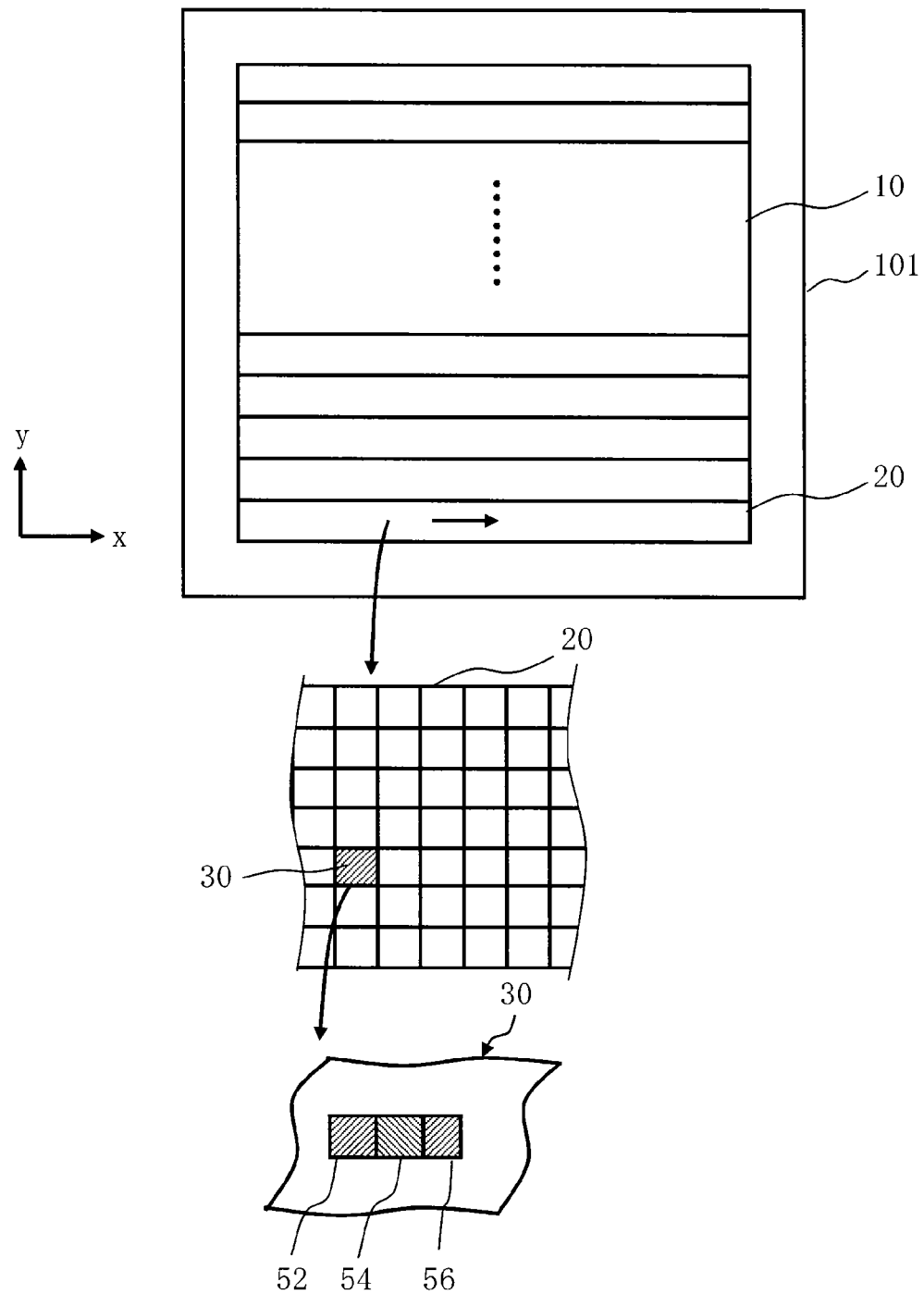
FIG. 2 is a conceptual diagram for explaining each region according to the first embodiment.

FIG. 2 is a conceptual diagram for explaining each region according to Embodiment 1. In FIG. 2, a writing region 10 of the target object 101 is virtually divided into a plurality of strip-like stripe regions 20 each having a width deflectable by the main deflector 208 in the y direction. Then, each stripe region 20 is divided into a plurality of subfields (SFs) 30 (small regions) each having the size deflectable by the sub deflector 209. Shot FIGS. 52, 54, and 56 are written at corresponding shot positions of each SF 30.

A digital signal for blanking control is output from the control circuit 120 to the DAC amplifier 122 to perform blanking control. Then, in the DAC amplifier 122 for blanking control, the digital signal is converted to an analog signal, and amplified to be applied as a deflection voltage to the blanking deflector 212. An electron beam 200 is deflected by this deflection voltage in order to control an irradiation time (dose) of each shot.

A digital signal for main deflection control is output from the control circuit 120 to a DAC amplifier (not shown). Then, in the DAC amplifier for main deflection control, the digital signal is converted to an analog signal, and amplified to be applied as a deflection voltage to the main deflector 208. The electron beam 200 is deflected by this deflection voltage, and thereby each shot beam is deflected to a reference position in a target SF 30 among virtually divided mesh like subfields (SFs) 30.

A digital signal for sub deflection control is output from the control circuit 120 to a DAC amplifier (not shown). Then, in the DAC amplifier for sub deflection control, the digital signal is converted to an analog signal, and amplified to be applied as a deflection voltage to the sub deflector 209. The electron beam 200 is deflected by this deflection voltage, and thereby each shot beam is deflected to each shot position in the target SF 30.

The writing apparatus 100 performs writing processing in each stripe region 20 by using a multiple stage deflector. In this case, a two-stage deflector composed of the main deflector 208 and the sub deflector 209 is used as an example. While the XY stage 105 is continuously moving in the −x direction, for example, the first stripe region 20 is written in the x direction. After the first stripe region 20 has been written, the second stripe region 20 is written similarly or in the opposite direction. Then, in the same way, the third and subsequent stripe regions 20 are written. The main deflector 208 deflects the electron beam 200 in sequence to a reference position of the SF 30 so as to follow the movement of the XY stage 105. The sub deflector 209 deflects the electron beam 200 from the reference position of each SF 30 to each shot position of an irradiating beam in the SF 30 concerned. Thus, the sizes of the deflection regions of the main deflector 208 and the sub deflector 209 are different from each other. The SF 30 is the smallest deflection region in the deflection regions of the multiple stage deflector.

The electron beam 200 emitted from the electron gun assembly 201 (an emission unit) is converged by the electron lens 211 at a predetermined height position in the blanking deflector 212, for example, and a convergence point (crossover: C.O.) is formed. When passing through the blanking deflector 212 which is arranged backward of the electron lens 211 with respect to the direction of the optical axis, beam-on or beam-off is controlled by the blanking deflector 212 controlled by a deflection signal from the DAC amplifier 122 for blanking. In other words, in the case of blanking control of switching between beam-on and beam-off, the blanking deflector 212 deflects the electron beam. The electron beam having been deflected in order to be in a beam-off state is blocked by the blanking aperture 214 (a blanking aperture member) arranged backward of the blanking deflector 212 with respect to the direction of the optical axis. That is, in the beam-on state, it is controlled to pass through the blanking aperture 214, and in the beam-off state, it is deflected so that the entire beam may be blocked by the blanking aperture 214. The electron beam 200 that has passed through the blanking aperture 214 during the period from a beam-off state to a beam-on state and again changing to a beam-off state serves as one shot of the electron beam. The blanking deflector 212 controls the direction of the passing electron beam 200 to alternately generate a beam-on state and a beam-off state. For example, it is acceptable to apply to the blanking deflector 212 a voltage of 0V (or not to apply any voltage) when in a beam-on state, and a voltage of several V when in a beam-off state. The dose per shot of the electron beam 200 to irradiate the target object 101 is adjusted depending upon an irradiation time "t" of each shot.

As described above, each shot of the electron beam 200, which is generated by passing through the blanking deflector 212 and the blanking aperture 214, irradiates the whole of the first shaping aperture 203, having a quadrangular opening, by the illumination lens 202. Here, the electron beam 200 is first shaped to a quadrangle. Then, after having passed through the first shaping aperture 203, the electron beam 200 of the first aperture image is projected onto the second shaping aperture 206 by the projection lens 204. The first aperture image on the second shaping aperture 206 is deflected and controlled by the deflector 205 so as to change (variably shape) the shape and size of the beam. Such variable beam shaping is performed for each shot, and, usually, each shot is shaped to have a different shape and size. Then, after having passed through the second shaping aperture 206, the electron beam 200 of the second aperture image is focused by the objective lens 207, and deflected by the main deflector 208 and the sub deflector 209 to reach a desired position on the target object 101 placed on the XY stage 105 which moves continuously. FIG. 1 shows the case of using multiple stage deflection of the main and sub deflection for position deflection. In such a case, the main deflector 208 may deflect the electron beam 200 of a shot concerned to a reference position in an SF 30 while following the movement of the stage, and the sub deflector 209 may deflect the shot beam to each irradiation position in the SF. A figure pattern defined in writing data is written by repeating such operations and combining a shot figure of each shot.

In the case of the DAC amplifier 122 for blanking control being unstable, a voltage may change during a beam-on period. For example, there occurs a voltage change of several mV (e.g., ±5 mV), or a larger voltage change may occur. The electron beam 200 passing through the blanking deflector 212 is deflected by such change.

Figures 3A, 3B:
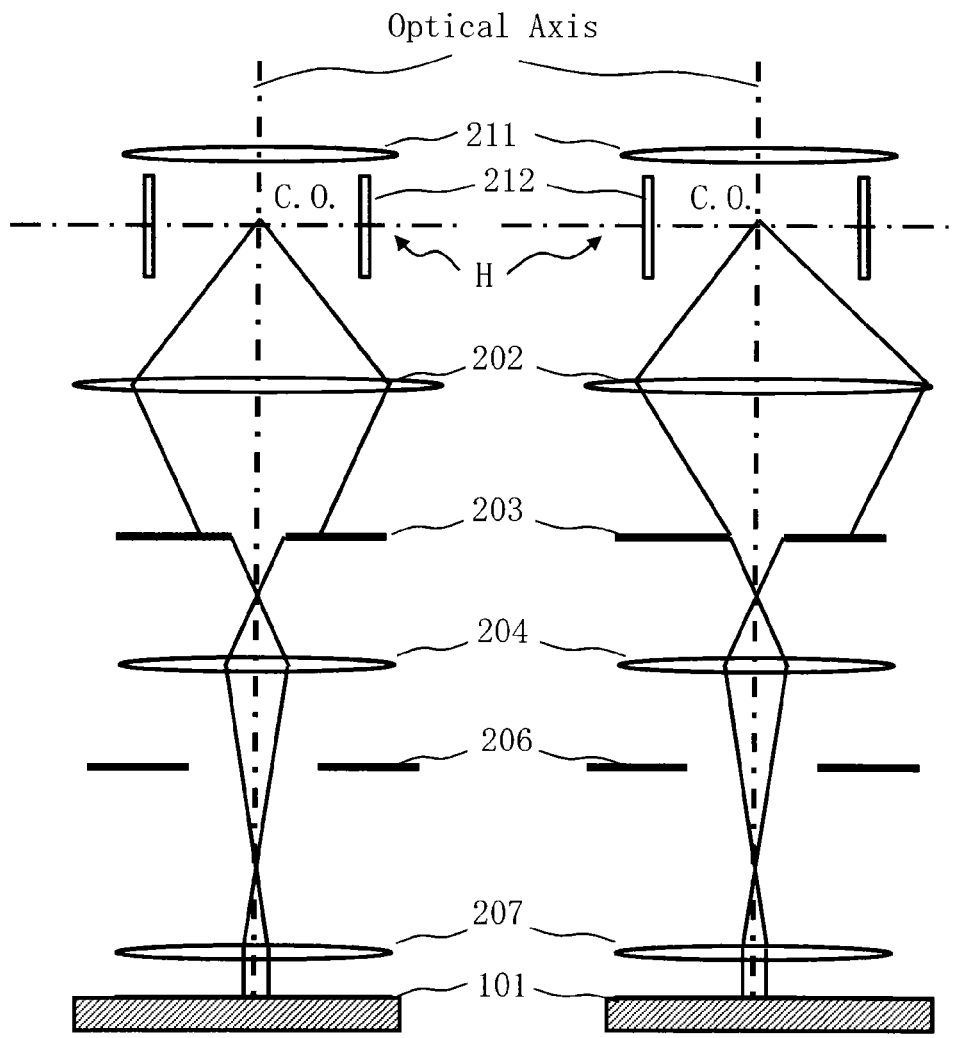
FIGS. 3A and 3B are conceptual diagrams showing comparison of the cases of blanking voltage change and no blanking voltage change when a crossover position is set to the center height position of the blanking deflector according to the first embodiment.

FIGS. 3A and 3B are conceptual diagrams showing comparison of a blanking voltage change and no blanking voltage change when a crossover position is set to the center height position of the blanking deflector according to the first embodiment. FIG. 3A shows the case where a blanking voltage (e.g., 0V) at the beam-on time is applied to the blanking deflector 212 and no voltage change (or a change of an ignorable extent) occurs in the blanking voltage. Moreover, FIG. 3A shows the case where no beam deflection other than a blanking operation is performed by the deflector 205 for shaping, the sub deflector 209, and the main deflector 208, and the beam passes along the optical axis, for example. In FIG. 3A, the electron beam 200 emitted from the electron gun assembly 201 (emission unit) is controlled by the electron lens 211 to form a convergence point (crossover: C.O.) in the center height position H in the blanking deflector 212. Since it is in the beam-on state in this case, the electron beam 200 passes without being blocked by the blanking deflector 212. An optical path of the crossover system is shown in FIG. 3A. The electron beam which has passed through the blanking deflector 212 illuminates the whole of the first shaping aperture 203 by the illumination lens 202. Then, the electron beam 200 of the first aperture image which has passed through the first shaping aperture 203 is projected to the opening formed in the second shaping aperture 206 by the projection lens 204. The electron beam 200 of the second aperture image which has passed through the second shaping aperture 206 is focused to form an image on the surface of the target object 101 by the objective lens 207. In this configuration, the electron beam 200 perpendicularly enters the surface of the target object 101. In other words, the beam incident angle θ is 0°.

FIG. 3B shows the state, changed from the state of FIG. 3A, where a voltage change in the extent not to trigger a beam-off state occurs in the blanking voltage to be applied to the blanking deflector 212. As shown in FIG. 3B, the beam is deflected in the center height position H of the blanking deflector 212 by a change of the blanking voltage. However, when the crossover position is set to the center height position of the blanking deflector 212, even if a blanking voltage change occurs, the electron beam 200 enters the surface of the target object 101 at an angle substantially equivalent to a perpendicular incidence. In other words, it is possible to make the beam incident angle θ be approximately 0°. In this configuration, since the crossover position does not deviate from the optical axis, the electron beam 200 can perpendicularly enter the surface of the target object 101.

Figures 4A, 4B:
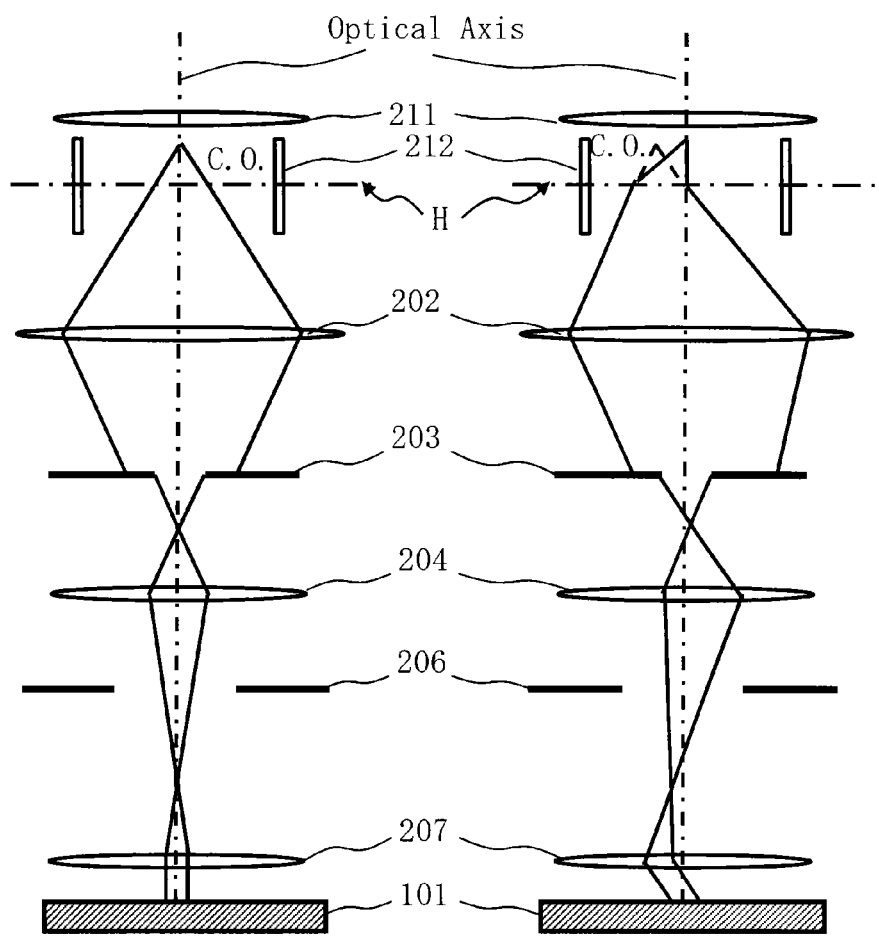
FIGS. 4A and 4B are conceptual diagrams showing comparison of the cases of blanking voltage change and no blanking voltage change when a crossover position deviates from the center height position of the blanking deflector according to the first embodiment.

FIGS. 4A and 4B are conceptual diagrams showing comparison of a blanking voltage change and no blanking voltage change when a crossover position deviates from the center height position of the blanking deflector according to the first embodiment. FIG. 4A shows the case where a blanking voltage (e.g., 0V) at the beam-on time is applied to the blanking deflector 212 and no voltage change (or a change of an ignorable extent) occurs in the blanking voltage. Moreover, FIG. 4A shows the case where no beam deflection other than a blanking operation is performed by the deflector 205 for shaping, the sub deflector 209, and the main deflector 208, and the beam passes along the optical axis, for example. In FIG. 4A, the electron beam 200 emitted from the electron gun assembly 201 (emission unit) is adjusted by the electron lens 211 to form a convergence point (crossover: C.O.) at a position higher than the center height position H in the blanking deflector 212, for example. Since it is in the beam-on state in this case, the electron beam 200 passes without being blocked by the blanking deflector 212. An optical path of the crossover system is shown in FIG. 4A. The electron beam which has passed through the blanking deflector 212 illuminates the whole of the first shaping aperture 203 by the illumination lens 202. Then, the electron beam 200 of the first aperture image which has passed through the first shaping aperture 203 is projected to the opening formed in the second shaping aperture 206 by the projection lens 204. The electron beam 200 of the second aperture image which has passed through the second shaping aperture 206 is focused to form an image on the surface of the target object 101 by the objective lens 207. In this configuration, the electron beam 200 perpendicularly enters the surface of the target object 101 so that the crossover position may not deviate from the optical axis as described later. In other words, the beam incident angle θ is 0°.

FIG. 4B shows the state, changed from the state of FIG. 4A, where a voltage change in the extent not to trigger a beam-off state occurs in the blanking voltage to be applied to the blanking deflector 212. As shown in FIG. 4B, the beam is deflected in the center height position H of the blanking deflector 212 by a change of the blanking voltage. However, when the crossover position is set to be higher than the center height position of the blanking deflector 212, if a blanking voltage change occurs, the electron beam 200 enters the surface of the target object 101 from the direction displaced from the vertical direction. In other words, the beam incident angle θ is not 0°. Consequently, in the defocused state, the beam irradiation position on the target object 101 deviates from a designed desired position. It means that, in FIG. 4B, from the point of view of the beam after deflection, the crossover position has apparently moved to the position of the broken line in the blanking deflector 212 from the position on the optical axis as described later.

Figure 5A:
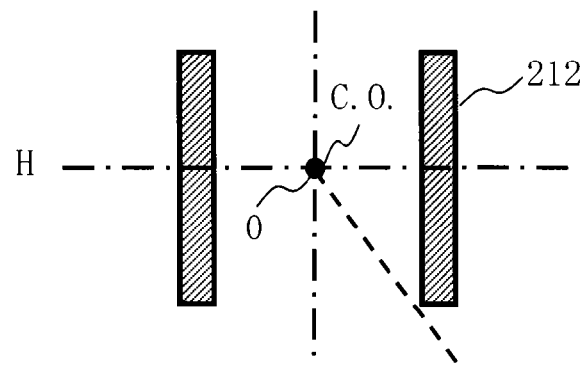
FIGS. 5A to 5D show a relation between the deflection fulcrum position and the crossover position at the time of the blanking operation according to the first embodiment.
Figure 5B:
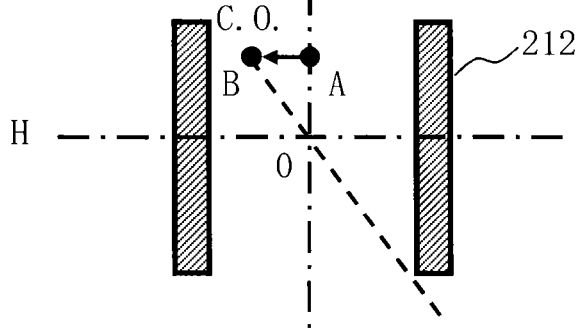
Figure 5C:
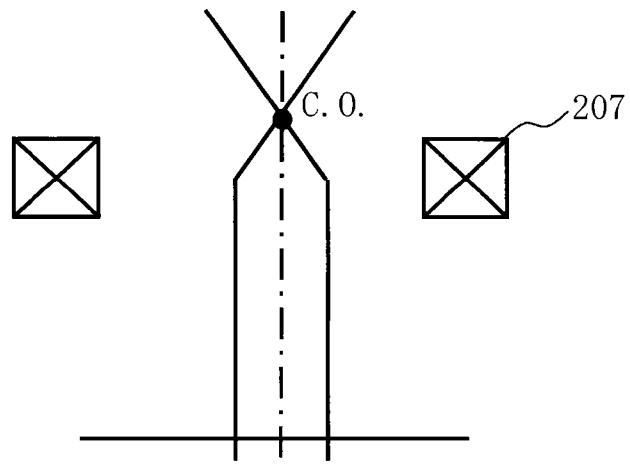
Figure 5D:
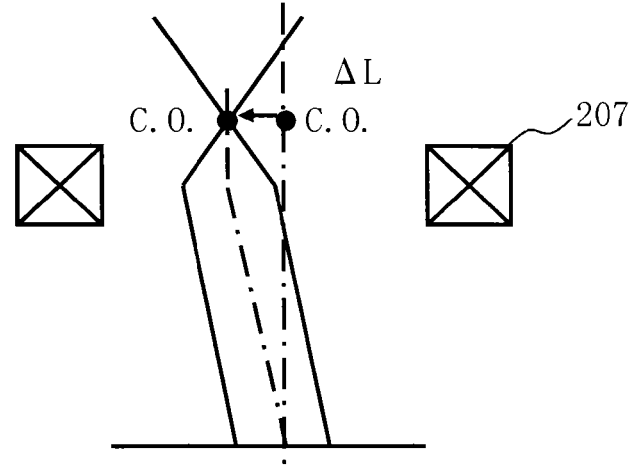

FIGS. 5A to 5D show a relation between the deflection fulcrum position and the crossover position at the time of the blanking operation according to the first embodiment. In FIG. 5A, it is adjusted to form a convergence point (crossover: C.O.), by the electron lens 211, in the center height position H in the blanking deflector 212. When a voltage is applied to the blanking deflector 212 and the electron beam 200 is deflected, the deflection fulcrum is located in the center height position H of the blanking deflector 212. When the crossover position is located in the center height position H of the blanking deflector 212, since the deflection fulcrum and the position are in accordance, the crossover position is on the optical axis. Therefore, as shown in FIG. 5C, the final crossover position is also formed at a position on the optical axis. On the other hand, as shown in FIG. 4B, when the crossover position deviates from the center height position H of the blanking deflector 212, the crossover position and the deflection fulcrum position do not accord with each other as shown in FIG. 5B. As described above, since the deflection fulcrum is located in the center height position H of the blanking deflector 212, from the point of view of the beam after deflection, the crossover position is apparently on the extended line of both the beam trajectory after deflection and the deflection fulcrum. Therefore, it means that the crossover position has moved to the position of the point B from the position of the point A on the optical axis. In other words, the crossover position is formed at the position displaced from the optical axis. As shown in FIG. 5D, the final crossover position of the beam is located at the position displaced from the optical axis by ΔL. Therefore, the beam deflected by the change of the blanking voltage enters the target object 101 at the beam incident angle θ which is not a perpendicular incidence of θ being 0. Consequently, when the focus position is displaced (when defocused), the center position of the irradiating beam deviates from a designed desired position. On the other hand, as shown in FIG. 4A, in the state where there is no change of blanking voltage, since the deflection fulcrum is not formed at all in the blanking deflector 212, the crossover position is on the optical axis. Therefore, in such a case, the beam enters the target object 101 at a perpendicular incidence of θ being 0 (θ=0). In the example described above, the crossover position deviates higher from the center height position H in the blanking deflector 212. However, even when it deviates downward, the result that the final crossover position of the beam is displaced from the optical axis can also be obtained.

Figures 6A, 6B:
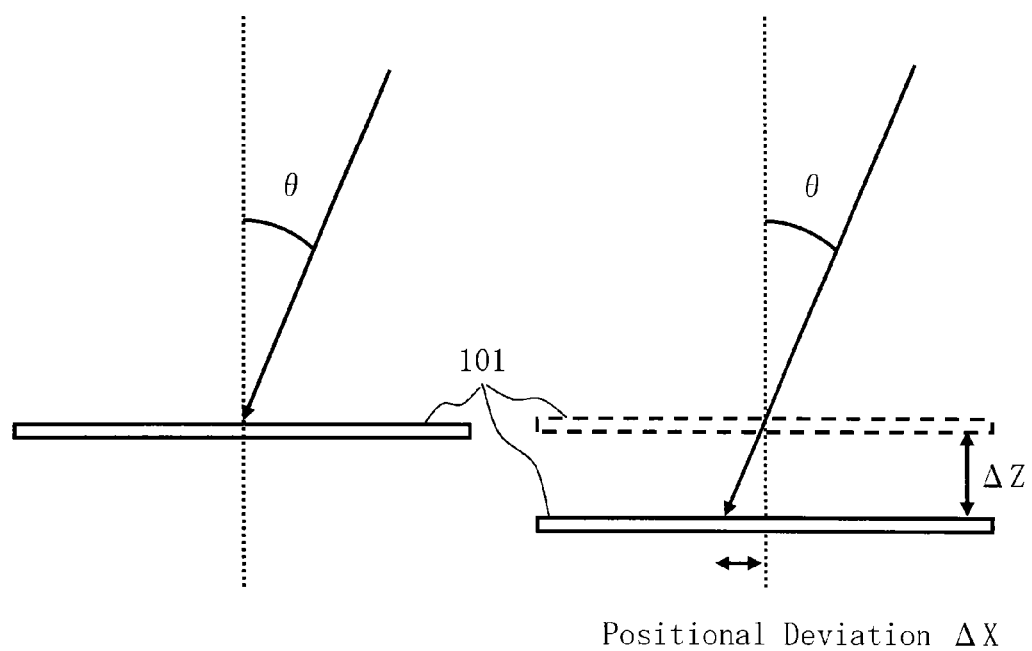
FIGS. 6A and 6B show a relation between a beam incident angle and a focus position according to the first embodiment.

FIGS. 6A and 6B show a relation between a beam incident angle and a focus position according to the first embodiment. As shown in FIG. 6A, when a focus position is focused on the surface of the target object 101, even if the beam incident angle θ is not 0° (even if the beam is not incident perpendicularly), the irradiation position of the beam is a designed desired position. On the other hand, as shown in FIG. 6B, when a focus position deviates (defocused) from the surface of the target object 101, if the beam incident angle θ is not 0° (if the beam is not incident perpendicularly), the irradiation position of the beam deviates from a designed desired position by a positional deviation amount Δx.

Then, according to the first embodiment, the electron lens 211 is adjusted so that a crossover position may be located in the center height position of the blanking deflector 212 in order to adjust a beam incident angle. It is necessary for such an adjustment to deflect a beam so that a deflection fulcrum may be formed in the center height position H of the blanking deflector 212 by using a deflection amount in the extent not to trigger a beam-off state during the beam-on period. Thus, according to the first embodiment, the magnet coil 216 is arranged in the center height position of the blanking deflector 212, and the electron beam 200 is deflected by a deflection amount in the extent not to trigger a beam-off state.

Figure 7:
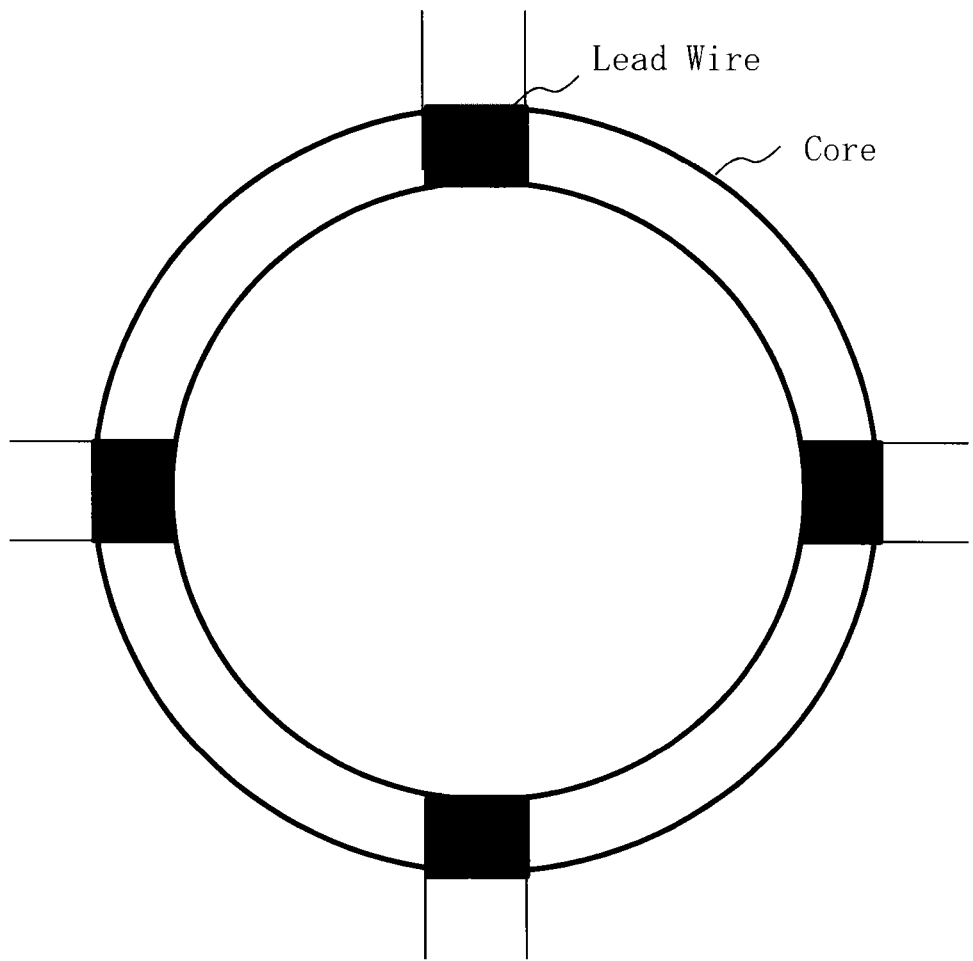
FIG. 7 is a conceptual diagram showing a configuration of a magnet coil according to the first embodiment.

FIG. 7 is a conceptual diagram showing the configuration of a magnet coil according to the first embodiment. In FIG. 7, the magnet coil 216 (e.g., an alignment coil) is formed by coiling an electric wire around the core of a doughnut shaped hollow disk. With regard to the electric wire, for example, it is preferable to use coiled ones located at four positions at every 90°. The magnet coil 216 may be arranged at the outside of the blanking deflector 212, for example.

Figure 8:
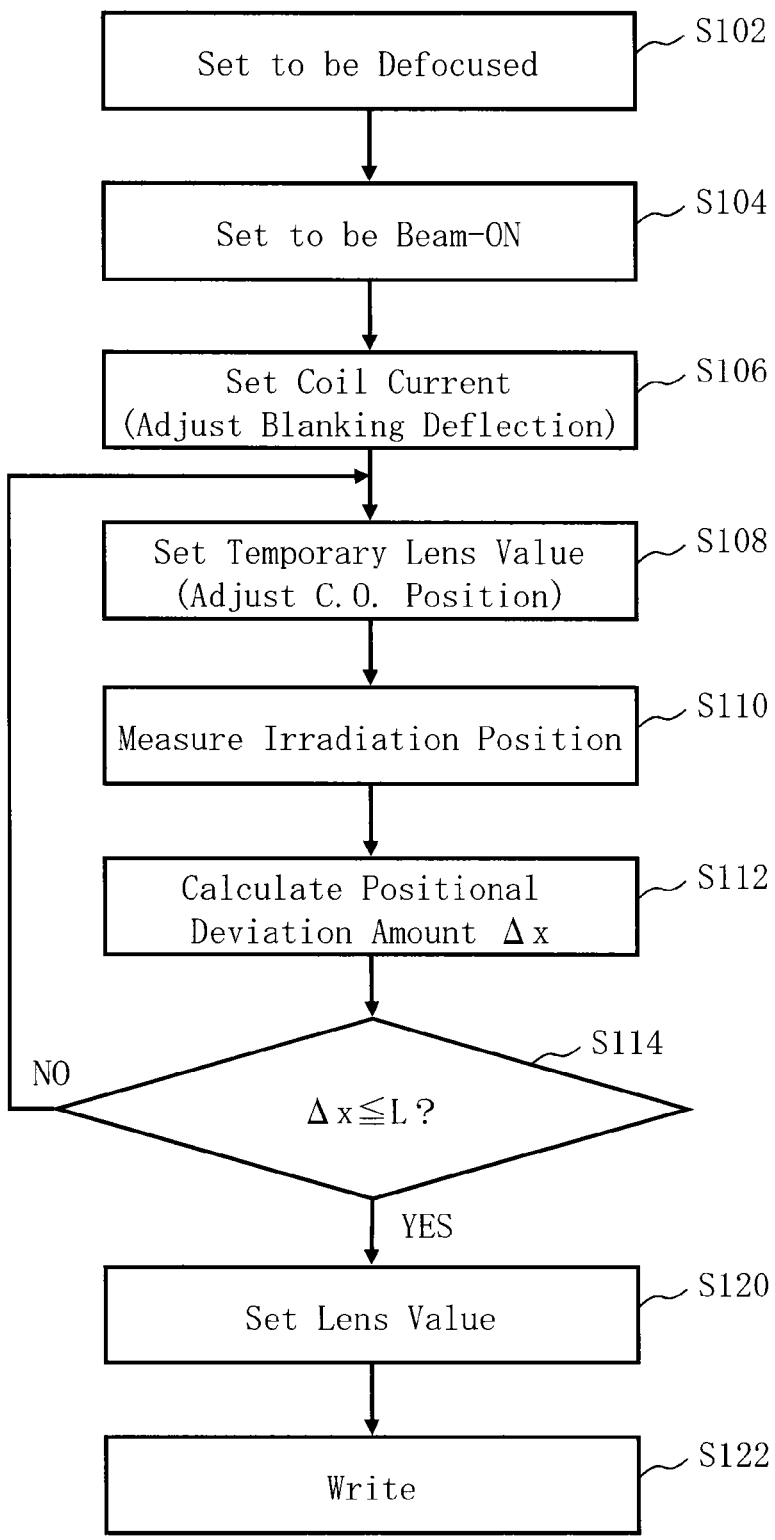
FIG. 8 is a flowchart showing main steps of a beam incident angle adjustment method according to the first embodiment.

FIG. 8 is a flowchart showing main steps of a beam incident angle adjustment method according to the first embodiment. In FIG. 8, the beam incident angle adjustment method according to the first embodiment executes a series of steps: a defocusing setting step (S102), a beam-on setting step (S104), a coil current setting step (S106), a lens value temporary setting step (S108), an irradiation position measuring step (S110), a positional deviation amount calculation step (S112), a determination step (S114), and a lens value setting step (S120). Moreover, a writing method according to the first embodiment executes a series of steps: each step of the beam incident angle adjustment method and a writing step (S122).

First, a usual adjustment of the electron optical system is performed. In such a state, for example, when not performing beam deflection other than a blanking operation, the incident angle θ (landing angle) of the electron beam 200 to the surface of the target object 101 at the blanking voltage of during the beam-on period is unknown.

In the defocusing setting step (S102), first, the voltage applied to the objective lens 207 is adjusted, and the focus position of the electron beam 200 is intentionally displaced (defocused) from the surface of the target object 101 (the surface of the mark 106). Alternatively, the focus position may be displaced using an electrostatic lens, etc. (not shown). Specifically, the writing control unit 66 outputs a control signal to the control circuit 120. The control circuit 120 applies a voltage to the objective lens 207 so that the lens value may be a specified one.

The example described above is effective particularly when the height position of the mark 106 on the XY stage 105 is set to be the same as that of the surface of the target object 101. However, it is not limited to the case where the focus position is displaced by the objective lens 207. For example, it is also preferable to preliminarily form the height position of the mark 106 on the XY stage 105 to be displaced by ΔZ from the height position of the surface of the target object 101. Alternatively, it is also preferable that a Z stage mechanism is added to the XY stage 105 in order to displace the focus position of the electron beam 200 from the surface of the target object 101 by moving the XY stage 105 in the heightwise direction.

In the beam-on setting step (S104), a voltage for beam-on is applied to the blanking deflector 212. Here, no voltage change or a change of an ignorable extent occurs in the voltage at the beam-on time of the blanking deflector 212. Alternatively, a voltage change may occur. Specifically, the writing control unit 66 outputs a control signal to the control circuit 120. The control circuit 120 outputs the control signal to the DAC amplifier 122 so that the deflection amount may be a specified one. After converting the digital signal to an analog signal, the DAC amplifier 122 amplifies it to be applied as a deflection voltage to the blanking deflector 212. Since it is the voltage for beam-on in this case, 0V voltage is applied, for example.

In the coil current setting step (S106), a current for a deflection amount which is smaller than a deflection amount for deflection to make a beam-off state by the blanking deflector 212 is supplied to the magnet coil 216. In other words, the electron beam 200 is deflected by the blanking aperture 214 in the extent of deflection not to trigger a beam-off state. It is preferable that this deflection amount is larger than a deflection amount generated by a voltage change of during a beam-on period of the blanking deflector 212. This is because if setting to be described later is performed by the preferably larger deflection amount (deflection voltage), the beam incident angle does not deviate by a voltage change amount less than the larger deflection amount. Specifically, the writing control unit 66 outputs a control signal to the control circuit 120. The control circuit 120 outputs the control signal to the coil control circuit 134 so that the current value may be a specified one. The coil control circuit 134 supplies the specified current to the magnet coil 216.

Figures 9A, 9B:
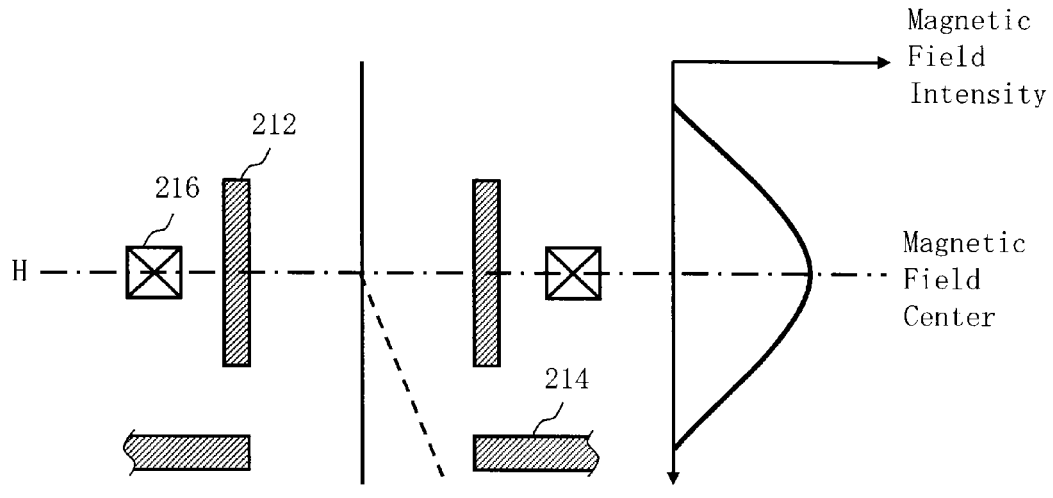
FIGS. 9A and 9B are conceptual diagrams for explaining a beam deflection by a magnet coil according to the first embodiment.

FIGS. 9A and 9B are conceptual diagrams for explaining a beam deflection by a magnet coil according to the first embodiment. As described above, when performing a blanking deflection of the electron beam 200 by the blanking deflector 212, the deflection fulcrum is located in the center height position H of the blanking deflector 212. Then, as shown in FIG. 9A, the magnet coil 216 is arranged in the center height position H of the blanking deflector 212. Thereby, as shown in FIG. 9B, the center of the magnetic field of the magnet coil 216 can be formed in the center height position H of the blanking deflector 212. A beam trajectory similar (symmetrical) to the one in the case of deflection by the blanking deflector 212 can be formed by deflecting an electron beam by using the magnet coil 216.

Figure 10:
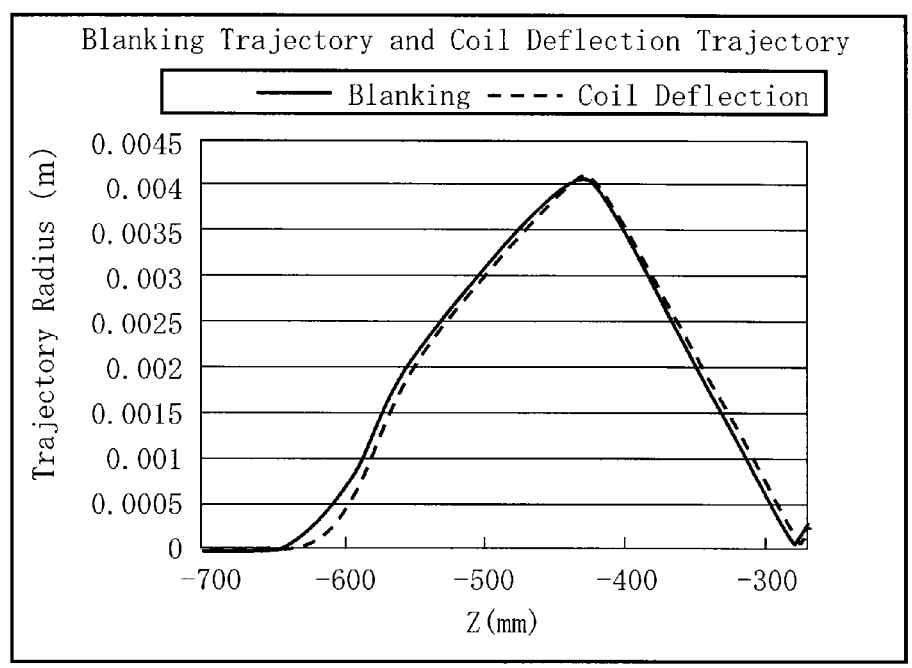
FIG. 10 shows an example of a blanking trajectory and a beam trajectory by a coil according to the first embodiment.

FIG. 10 shows an example of a blanking trajectory and a beam trajectory by a coil according to the first embodiment. FIG. 10 shows a result of calculation of simulating a beam trajectory for which blanking deflection in the extent not to trigger a beam-off state has been performed by the blanking deflector 212. Furthermore, FIG. 10 also shows a result of calculation of simulating a beam trajectory when a beam deflection is performed by the magnet coil 216 such that the deflection amount is to be the same. As shown in FIG. 10, both the trajectories are almost the same. Therefore, it turns out that it is effective to deflect the electron beam 200 by using the magnet coil 216 instead of the blanking deflector 212 when measuring a beam incident angle.

Figure 11:
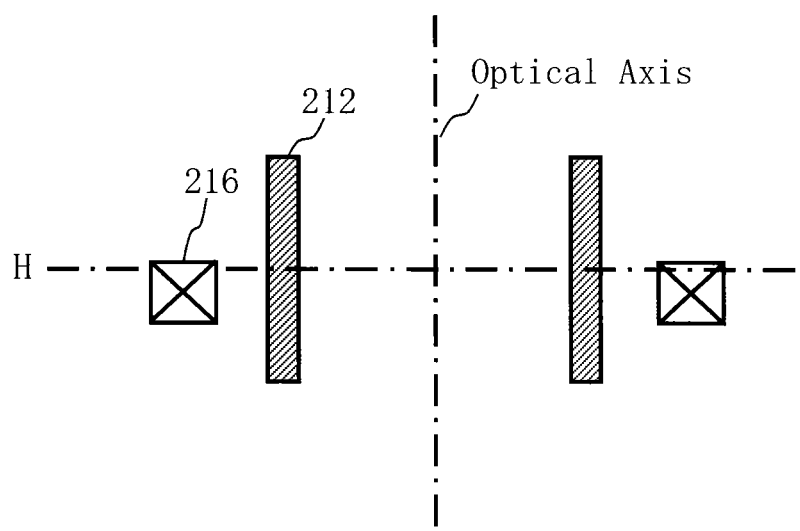
FIG. 11 is a conceptual diagram for explaining an arrangement position of a magnet coil according to the first embodiment.

FIG. 11 is a conceptual diagram for explaining an arrangement position of a magnet coil according to the first embodiment. In the example described above, although the magnet coil 216 is arranged in the center height position H of the blanking deflector 212, it is not limited to the case where the center of the magnet coil 216 is perfectly in accordance with the center height position H of the blanking deflector 212. The same effect can be produced in a case such as the case where some part of the magnet coils 216 is arranged in the center height position H of the blanking deflector 212 as shown in FIG. 11, for example.

In the lens value temporary setting step (S108), a temporary applied voltage is set in the electron lens 211. It is acceptable to first use the lens value, as it is, which was set in a usual adjustment of the electron optical system. Specifically, the writing control unit 66 outputs a control signal to the control circuit 120. The control circuit 120 outputs the control signal to the lens control circuit 130 so that the voltage value may be a specified one. The lens control circuit 130 applies the specified voltage to the electron lens 211.

In the irradiation position measuring step (S110), the measurement unit 60 irradiates the electron beam 200 onto the target object 101 in the state described above, and measures the irradiation position of the electron beam 200 irradiating the target object 101. Specifically, first, the XY stage 105 is moved so that the mark 106 on the XY stage 105 may be arranged at a designed irradiation position of the electron beam 200. In such a state, scanning is performed in the x and y directions on the mark 106, which is assumed to be the surface of the target object 101, by irradiating the electron beam 200 and deflecting it in the x and y directions by the sub deflector 209, for example. Then, the detection device 220 detects (measures) a reflected electron or a secondary electron generated at the mark 106 and its circumference. The output of the detection device 220 is converted into a digital signal and amplified by the amplifier 138, and input into the control computer 110. In the control computer 110, the measurement unit 60 calculates an irradiation position of the beam based on a scanning result. The irradiation position of the beam is output outside through the external I/F circuit 112 and the like.

In the positional deviation amount calculation step (S112), the positional deviation amount calculation unit 62 calculates a positional deviation amount from the design position of the irradiation position of the beam. The positional deviation amount is output outside through the external I/F circuit 112 and the like.

As described above, a positional deviation amount Δx from the design position of a beam irradiation position is measured. Although, in this case, the positional deviation amount Δx in the x direction is described in order to clarify the explanation, it is preferable to similarly measure also a positional deviation amount in the y direction.

In the determination step (S114), the determination unit 64 determines whether a positional deviation amount is less than or equal to an allowable value L. Then, as a result of the determination, when the positional deviation amount is not less than or equal to the allowable value L, it returns to the lens value temporary setting step (S108). When the positional deviation is less than or equal to the allowable value L, it goes to the lens value setting step (S120). In the lens value temporary setting step (S108), the lens value is set as a variable and steps from the lens value temporary setting step (S108) to the determination step (S114) are repeated until the positional deviation amount becomes less than or equal to the allowable value L.

As described above, a voltage for beam-on is applied to the blanking deflector 212, an electron beam is converged by varying a voltage applied to the electron lens 211 while supplying to the magnet coil 216 a current for a deflection amount which is smaller than a deflection amount for deflection to make a beam-off state by the blanking deflector 212, and a positional deviation amount of the irradiation position of the electron beam 200 irradiating the target object 101 is measured for each voltage applied to the electron lens 211. It is determined, for each voltage applied to the electron lens, whether the positional deviation amount is less than or equal to the allowable value L. If the positional deviation amount is less than or equal to the allowable value L, the beam incident angle θ can be a perpendicular incidence substantially.

In the lens value setting step (S120), the lens value (voltage value) at the time of a positional deviation amount becoming less than or equal to the allowable value L is set to the electron lens 211. As described above, the voltage to be applied to the electron lens 211 is adjusted so that the positional deviation amount of a beam irradiation position may be within the allowable value L. Specifically, the writing control unit 66 outputs a control signal to the control circuit 120. The control circuit 120 outputs the control signal to the lens control circuit 130 so that the voltage value may be a specified one. The lens control circuit 130 applies the specified voltage to the electron lens 211.

Thus, the crossover position of the electron beam 200 converged by the electron lens 211 is adjusted to be in the center height position H of the blanking deflector 212. Therefore, as explained with reference to FIGS. 3B and 5A, when the crossover position is set to be in the center height position of the blanking deflector 212, even if a blanking voltage change occurs, the electron beam 200 enters the surface of the target object 101 at an angle substantially equivalent to a perpendicular incidence. In other words, it is possible to make the beam incident angle θ be approximately 0°.

As described above, according to the first embodiment, it is possible to make a beam incident angle to the target object surface unchanged even when a blanking voltage changes during a beam-on period.

In the writing step (S122), a pattern is written on the target object 101 by using the electron beam 200 whose incident angle to the target object surface has been adjusted by the above-described method of adjusting a beam incident angle to the surface of the target object 101, while a blanking operation is being performed by the blanking deflector 212. The writing operation is what has been described above. The position accuracy of writing can be increased by performing writing by the writing apparatus 100 whose incident angle has been adjusted as described above.

Second Embodiment

Although, in the first embodiment, the magnet coil 216 is arranged in the center height position H of the blanking deflector 212, the configuration for forming the same beam trajectory as that deflected by the blanking deflector 212 is not limited thereto. In the second embodiment, the same beam trajectory as that deflected by the blanking deflector 212 is formed by using a plurality of magnet coils according to another configuration.

Figure 12:
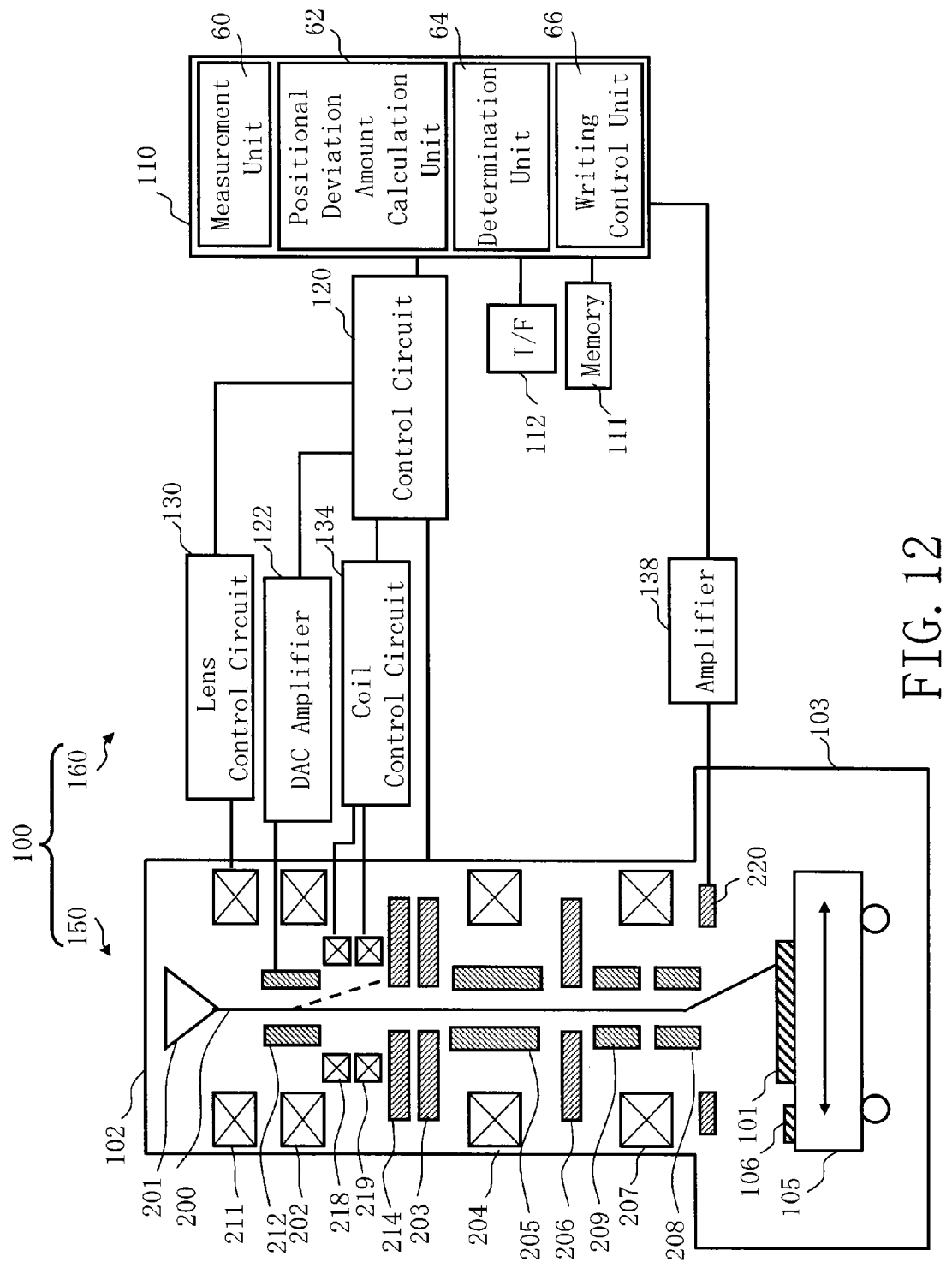
FIG. 12 is a conceptual diagram showing a configuration of a writing apparatus according to the second embodiment.

FIG. 12 is a conceptual diagram showing the configuration of a writing apparatus according to the second embodiment. FIG. 12 is the same as FIG. 1 except that, instead of the magnet coil 216, a plurality of magnet coils 218 and 219 are arranged at positions different from that of the magnet coil 216. Moreover, the flowchart showing main steps of a beam incident angle adjustment method according to the second embodiment is the same as that of FIG. 8. The content of the second embodiment is the same as that of the first embodiment except what is particularly described below.

Figure 13:
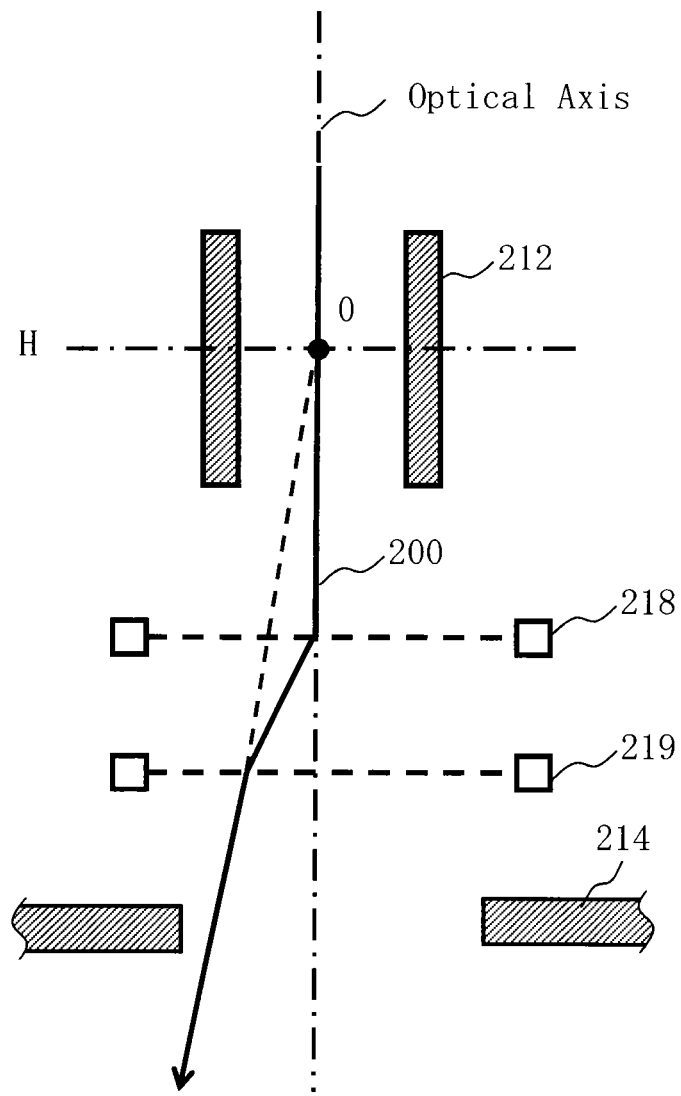
FIG. 13 is a conceptual diagram for explaining an arrangement position of a plurality of magnet coils and a beam deflection by a plurality of magnet coils according to the second embodiment.

FIG. 13 is a conceptual diagram for explaining arrangement positions of a plurality of magnet coils and a beam deflection by a plurality of magnet coils according to the second embodiment. In the second embodiment, as shown in FIG. 13, a plurality of magnet coils 218 and 219 are arranged backward of the blanking deflector 212 with respect to the direction of the optical axis. The electron beam 200 is deflected by the magnet coils 218 and 219. The arrangement positions of a plurality of magnet coils 218 and 219 may be arbitrary positions as long as they are backward of the blanking deflector 212 and forward of the final crossover position with respect to the direction of the optical axis.

In the coil current setting step (S106), a plurality of magnet coils 218 and 219 receive a current for a deflection amount which is smaller than a deflection amount for deflection to make a beam-off state by the blanking deflector 212, wherein the intersection of the optical axis and an extended line of the trajectory of the electron beam 200 deflected by a plurality of magnet coils 218 and 219 is located in the center height position H of the blanking deflector 212. In other words, the electron beam 200 is deflected by the blanking aperture 214 in the extent of deflection not to trigger a beam-off state. Thereby, the magnetic field formed by a plurality of magnet coils 218 and 219 is adjusted so that the intersection of the optical axis and the extended line of the trajectory of the electron beam 200 deflected by a plurality of magnet coils 218 and 219 may be located in the center height position of the blanking deflector 212. By virtue of employing a plurality of magnet coils 218 and 219, the beam can be deflected from the optical axis by the magnet coil 218 and a reverse deflection can be performed for reversing a part of a deflection amount of the deflection of the beam by the magnet coil 219. By this multi-stage deflection, the intersection of the optical axis and the extended line of the trajectory of the electron beam 200 is adjusted to be located in the center height position of the blanking deflector 212. When the magnet coil is not arranged in the center height position H of the blanking deflector 212, it is necessary to perform reverse deflection for the deflected beam in order to adjust a beam trajectory such that the deflection fulcrum is apparently located in the center height position of the blanking deflector 212. This can be attained by a plurality of magnet coils 218 and 219. Specifically, the writing control unit 66 outputs a control signal to the control circuit 120. The control circuit 120 outputs the control signal to the coil control circuit 134 so that it may be a combination of specified current values. The coil control circuit 134 respectively supplies specified currents to the magnet coils 218 and 219. It is preferable that a deflection amount by the magnet coils 218 and 219 is a voltage larger than that changes during a beam-on period of the blanking deflector 212.

As described above, with the configuration according to the second embodiment, the same effect as that of the first embodiment can be produced.

Third Embodiment

Although, in the embodiments described above, a minute deflection is produced by using the magnet coil 216 or the magnet coils 218 and 219, it is not limited thereto. In the third embodiment, there will be described a configuration in which an amplifier for adjustment is additionally prepared to perform deflection by the blanking deflector 212.

Figure 14:
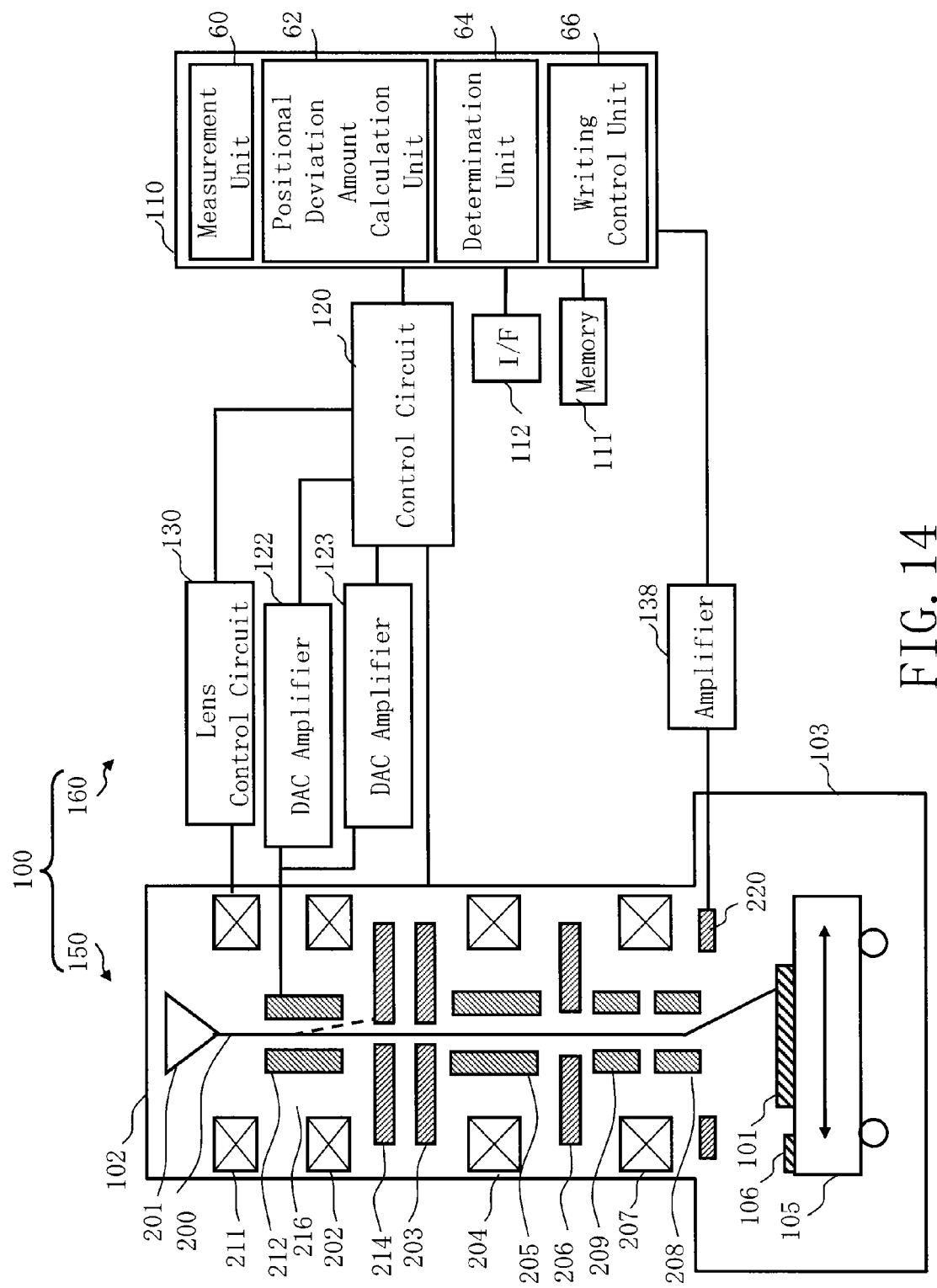
FIG. 14 is a conceptual diagram showing a configuration of a writing apparatus according to the third embodiment.

FIG. 14 is a conceptual diagram showing the configuration of a writing apparatus according to the third embodiment. FIG. 14 is the same as FIG. 1 except that a DAC amplifier 123 is arranged instead of the magnet coil 216 and the coil control circuit 132. Moreover, the flowchart showing main steps of a beam incident angle adjustment method according to the third embodiment is the same as that of FIG. 8 except that coil current setting (blanking deflection adjustment) of S106 in FIG. 8 is read as "blanking deflection adjustment". The content of the third embodiment is the same as that of the first or second embodiment except what is particularly described below.

In FIG. 14, the DAC amplifier 123 (the second amplifier) is connected in parallel with the DAC amplifier 122 (the first amplifier) to the blanking deflector 212. It is sufficient for the DAC amplifier 123 to output a voltage for deflecting the electron beam 200 in the extent of deflection not to trigger a beam-off state. Therefore, the response speed of the DAC amplifier 123 may be slower than that of the DAC amplifier 122.

In the blanking deflection adjustment step (S106), the DAC amplifier 123 applies, to the blanking deflector 212, a voltage for deflecting the electron beam 200 in the extent of deflection not to trigger a beam-off state from the beam-on state by the blanking deflector 212. It is preferable that this deflection amount is larger than that generated by a voltage change of during a beam-on period of the blanking deflector 212. This is because if setting to be described later is performed by the preferably larger deflection amount (deflection voltage), the beam incident angle does not deviate by a voltage change amount less than the larger deflection amount. Specifically, the writing control unit 66 outputs a control signal to the control circuit 120. The control circuit 120 outputs the control signal to the DAC amplifier 123 so that the voltage value may be a specified one. The DAC amplifier 123 converts the digital signal to an analog signal to be amplified and applies the specified voltage as a deflection voltage to the blanking deflector 212.

As described above, the same effect as that according to the first or second embodiment can be produced even when an amplifier for adjustment is additionally prepared in order to perform deflection by the blanking deflector 212.

Fourth Embodiment

In the fourth embodiment, there will be explained a configuration in which adjustment of a beam incident angle is performed by adjusting the beam center on the objective lens 207. The content of the fourth embodiment is the same as that of the first, second, or third embodiment except what is particularly described below.

Figure 15:
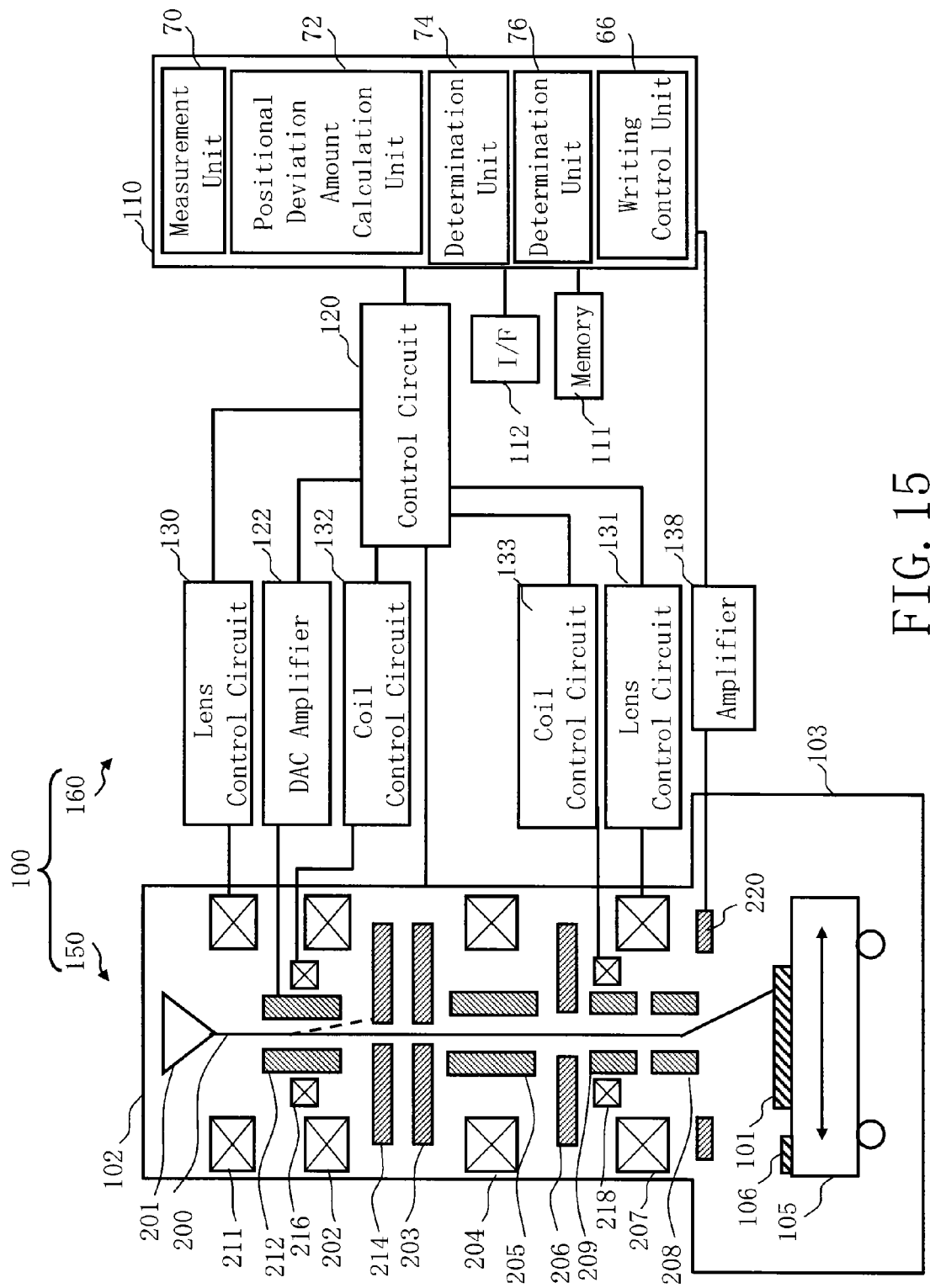
FIG. 15 is a conceptual diagram showing a configuration of a writing apparatus according to the fourth embodiment.

FIG. 15 is a conceptual diagram showing the configuration of a writing apparatus according to the fourth embodiment. FIG. 15 is the same as FIG. 1 except that a measurement unit 70, a positional deviation amount calculation unit 72, and determination units 74 and 76 are arranged, instead of the measurement unit 60, the positional deviation amount calculation unit 62, and the determination unit 64, in the control computer 110, and except that a magnet coil 218, a coil control circuit 133, and a lens control circuit 131 are added. Each function such as the measurement unit 70, the positional deviation amount calculation unit 72, the determination units 74 and 76, and the writing control unit 66 may be configured by hardware such as an electronic circuit or by software such as a program causing a computer to implement these functions. Alternatively, it may be configured by a combination of hardware and software. Data which is input and output to/from the measurement unit 70, the positional deviation amount calculation unit 72, the determination units 74 and 76, and the writing control unit 66 and data being calculated are stored in the memory 112 each time. With regard to the lens control circuit 131, it should be understood that description of it is omitted in the figure, although it exists, or it is included in the control circuit 120, in the first, second, and third embodiments. The magnet coil 218 is arranged between the blanking deflector 212 and the objective lens 207. It is preferable for the height position of the mark 106 to be the same as that of the surface of the target object 101. The height position of arrangement itself of the mark 106 may be the same as that of the surface of the target object 101, or the height position of the mark 106 may be adjusted to be the same as that of the surface of the target object 101 at the time of writing by adding a Z-stage mechanism to the XY stage 105 in order to move the XY stage 105 in the height direction.

Figure 16:
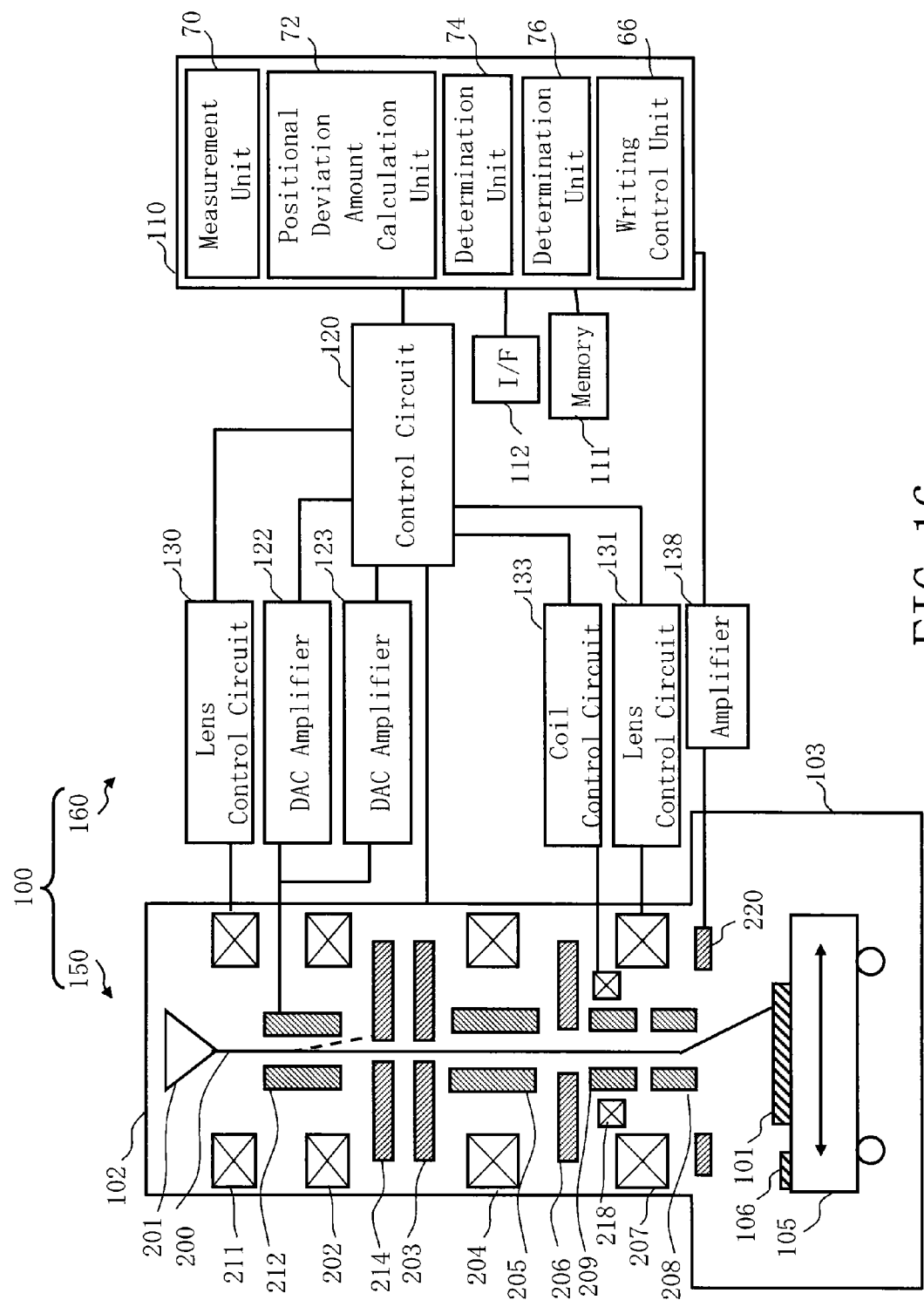
FIG. 16 is a conceptual diagram showing another configuration of a writing apparatus according to the fourth embodiment.

FIG. 16 is a conceptual diagram showing another configuration of a writing apparatus according to the fourth embodiment. FIG. 16 is the same as FIG. 15 except that the DAC amplifier 123 is arranged instead of the magnet coil 216 and the coil control circuit 132.

As shown in FIG. 4B, when the crossover position is set to be higher than the center height position of the blanking deflector 212, if a blanking voltage change occurs, the beam center position of the electron beam 200 deviates from the center of the magnetic field of the objective lens 207. Then, using this phenomenon, according to the fourth embodiment, adjustment of a beam incident angle is performed by adjusting an applied voltage to the electron lens 211 so that the beam center position of the electron beam 200 may approach the center of the magnetic field of the objective lens 207.

Figure 17:
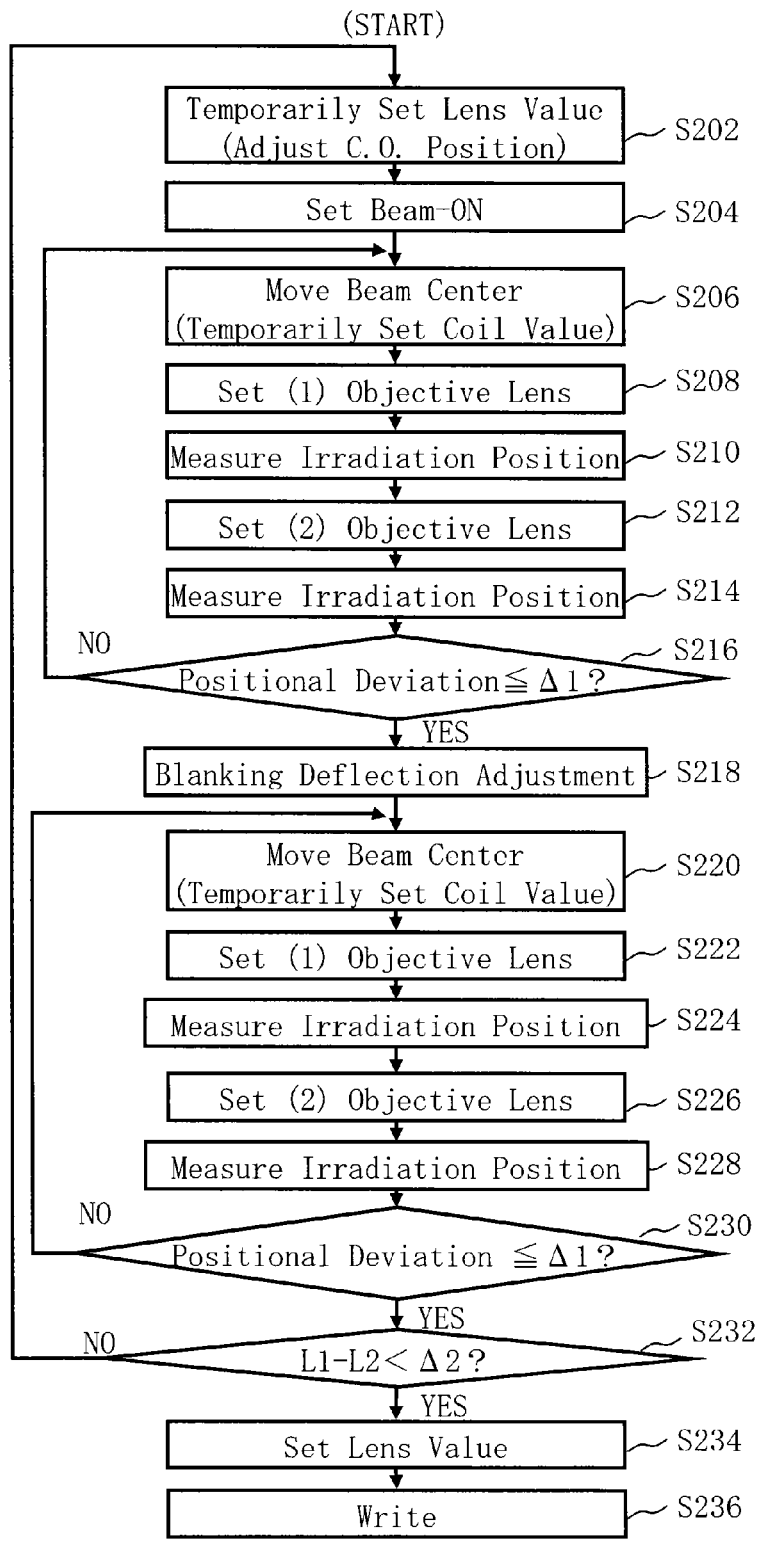
FIG. 17 is a flowchart showing main steps of a beam incident angle adjustment method according to the fourth embodiment.

FIG. 17 is a flowchart showing main steps of a beam incident angle adjustment method according to the fourth embodiment. In FIG. 17, the beam incident angle adjustment method according to the fourth embodiment executes a series of steps: a lens value temporary setting step (S202), a beam-on setting step (S204), a beam center move step (S206), an objective lens setting (1) step (S208), an irradiation position measuring step (S210), an objective lens setting (2) step (S212), an irradiation position measuring step (S214), a determination step (S216), a blanking deflection adjustment step (S218), a beam center move step (S220), an objective lens setting (1) step (S222), an irradiation position measuring step (S224), an objective lens setting (2) step (S226), an irradiation position measuring step (S228), a determination step (S230), a determination step (S232), and a lens value setting step (S234). Moreover, the writing method according to the fourth embodiment executes a series of steps: each step of the beam incident angle adjustment method and a writing step (S236).

In the lens value temporary setting step (S202), a temporary applied voltage is set in the electron lens 211. It is acceptable to first use the lens value, as it is, which was set in a usual adjustment of the electron optical system. Specifically, the writing control unit 66 outputs a control signal to the control circuit 120. The control circuit 120 outputs the control signal to the lens control circuit 130 so that the voltage value may be a specified one. The lens control circuit 130 applies the specified voltage to the electron lens 211.

In the beam-on setting step (S204), a voltage for beam-on is applied to the blanking deflector 212. Here, no voltage change or a change of an ignorable extent occurs in the voltage at the beam-on time of the blanking deflector 212. Alternatively, a voltage change may occur. Specifically, the writing control unit 66 outputs a control signal to the control circuit 120. The control circuit 120 outputs the control signal to the DAC amplifier 122 so that the deflection amount may be a specified one. After converting the digital signal to an analog signal, the DAC amplifier 122 amplifies it to be applied as a deflection voltage to the blanking deflector 212. Since it is the voltage for beam-on in this case, 0V voltage is applied, for example.

In the beam center move step (S206), the center of the electron beam 200 is moved by deflecting the electron beam 200 toward the center of the objective lens 207 by using the magnet coil 218. It is desirable to adjust so that the center position of the electron beam 200 may be located at the center position of the magnetic field of the objective lens 207. Specifically, the writing control unit 66 outputs a control signal to the control circuit 120. The control circuit 120 outputs the control signal to the coil control circuit 133 so that the current value may be a specified one. The coil control circuit 133 supplies the specified current to the magnet coil 218. Here, first, a temporary current value is set.

In the objective lens setting (1) step (S208), the focus position of the electron beam 200 is set by the objective lens 207. The focus is, in this case, set at a height position different from that of the mark 106 height. Specifically, the writing control unit 66 outputs a control signal to the control circuit 120. The control circuit 120 outputs the control signal to the lens control circuit 131 so that the voltage value may be a specified one. The lens control circuit 131 applies the specified voltage to the objective lens 207.

Figure 18:
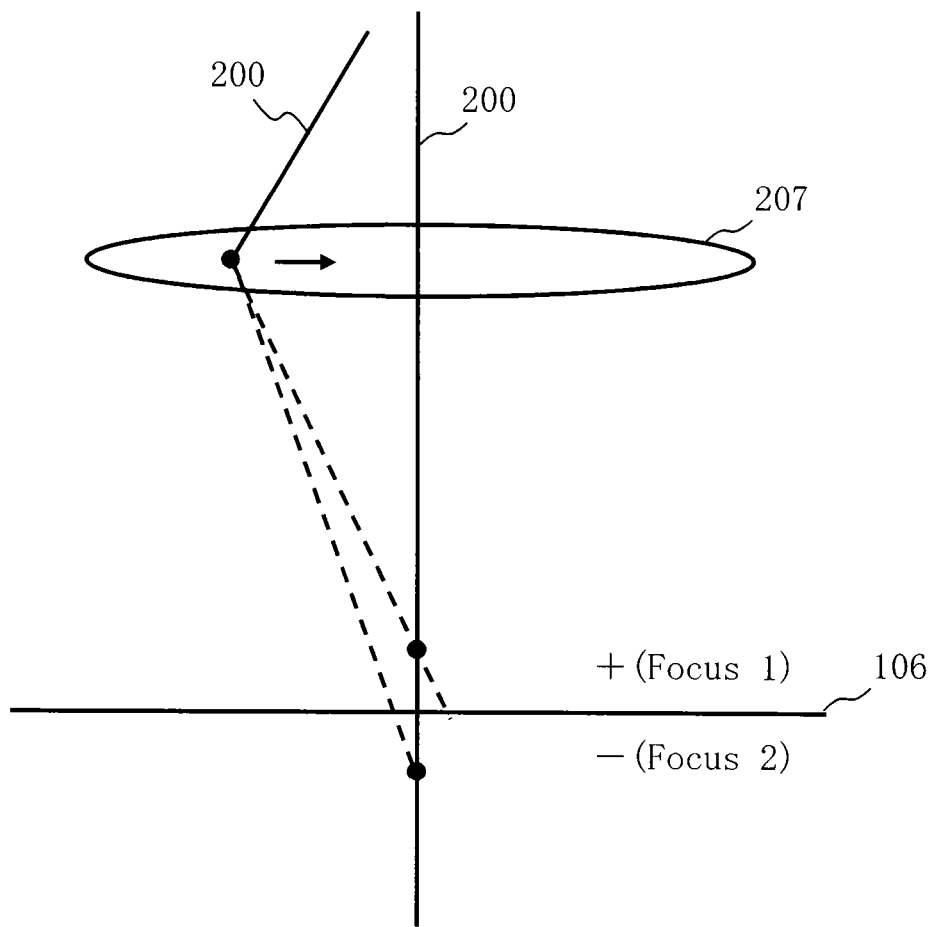
FIG. 18 shows an example of the focus position according to the fourth embodiment.
Figure 19:
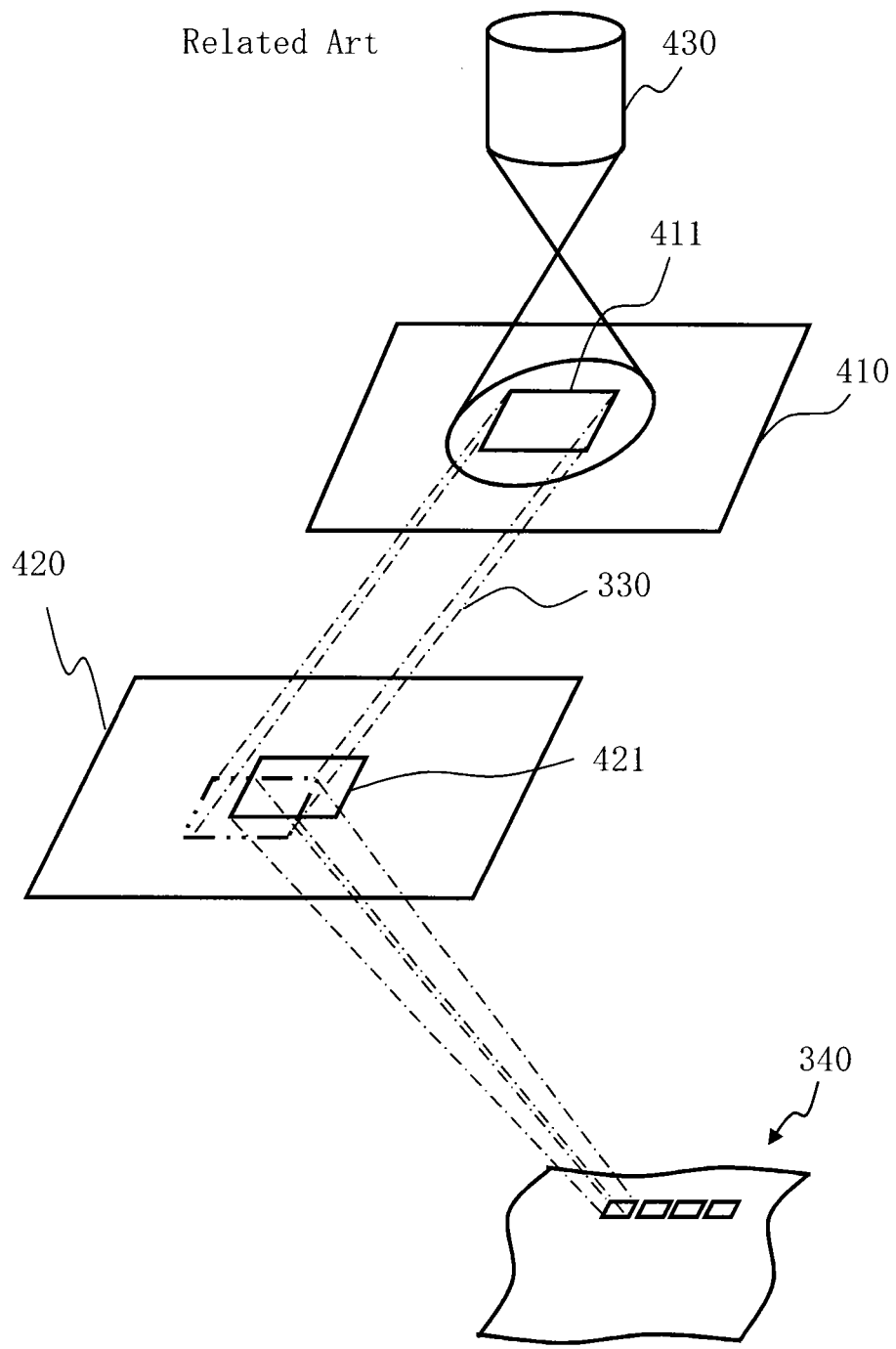
FIG. 19 is a conceptual diagram for explaining an operation of a variable-shaped electron beam writing apparatus.

FIG. 18 shows an example of the focus position according to the fourth embodiment. In FIG. 18, the focus position is set to be upward or downward of the height position of the mark 106 (the surface position of the target object 101). In this case, the focus position (focus 1) is adjusted to be upward (positive (+) in the z direction), for example.

In the irradiation position measuring step (S210), the measurement unit 70 irradiates the electron beam 200 onto the mark 106 (target object 101) in the state described above, and measures the irradiation position of the electron beam 200 irradiating the mark 106 (target object 101). Specifically, first, the XY stage 105 is moved so that the mark 106 on the XY stage 105 may be arranged at a designed irradiation position of the electron beam 200. In such a state, scanning is performed in the x and y directions on the mark 106 by irradiating the electron beam 200 and deflecting it in the x and y directions by the sub deflector 209, for example. Then, the detection device 220 detects (measures) a reflected electron or a secondary electron generated at the mark 106 and its circumference. The output of the detection device 220 is converted into a digital signal and amplified by the amplifier 138, and input into the control computer 110. In the control computer 110, the measurement unit 70 calculates an irradiation position of the beam based on a scanning result. The irradiation position of the beam is output outside through the external I/F circuit 112 and the like.

In the objective lens setting (2) step (S212), the focus position of the electron beam 200 is set at another height position by the objective lens 207. Here, also, the focus is set at a height position different from that of the mark 106. In this case, as shown in FIG. 18, the focus position (focus 2) is adjusted to be downward (negative (−) in the z direction), for example.

In the irradiation position measuring step (S214), the measurement unit 70 irradiates the electron beam 200 onto the mark 106 (target object 101) in the state described above, and measures the irradiation position of the electron beam 200 irradiating the mark 106 (target object 101). Specifically, scanning is performed in the x and y directions on the mark 106 by irradiating the electron beam 200 and deflecting it in the x and y directions by the sub deflector 209, for example. Then, the detection device 220 detects (measures) a reflected electron or a secondary electron generated at the mark 106 and its circumference. The output of the detection device 220 is converted into a digital signal and amplified by the amplifier 138, and input into the control computer 110. In the control computer 110, the measurement unit 70 calculates an irradiation position of the beam based on a scanning result. The irradiation position of the beam is output outside through the external I/F circuit 112 and the like.

In the determination step (S216), first, the positional deviation amount calculation unit 72 calculates a difference between the irradiation position on the mark 106 at the positive (+) side focus position indicated by the focus 1 and the irradiation position on the mark 106 at the negative (−) side focus position indicated by the focus 2. Then, the determination unit 74 determines whether the positional deviation amount between the measured irradiation positions is less than or equal to a threshold value Δ1 (first threshold value). If the positional deviation amount between the measured irradiation positions is not less than or equal to the threshold value Δ1, it returns to the beam center move step (S206), and repeats steps from the beam center move step (S206) to the determination step (S216) until the positional deviation amount becomes less than or equal to the threshold value Δ1. The closer the center position of the electron beam 200 approaches the center position of the magnetic field of the objective lens 207, the smaller the deviation amount between the measured irradiation positions becomes. That is, if the positional deviation amount between the measured irradiation positions is less than or equal to the threshold value Δ1, it means that the center position of the electron beam 200 has further approached the center position of the magnetic field of the objective lens 207. In other words, the center of the electron beam 200 is moved toward the center of the objective lens 207 by using the magnet coil 218 so that the positional deviation amount between the measured irradiation positions may be less than or equal to the threshold value Δ1.

In the blanking deflection adjustment step (S218), in the case of FIG. 15, a current for a deflection amount which is smaller than a deflection amount for deflection to make a beam-off state by the blanking deflector 212 is supplied to the magnet coil 216. In other words, the electron beam 200 is deflected by the blanking aperture 214 in the extent of deflection not to trigger a beam-off state. It is preferable that this deflection amount is larger than that generated by a voltage change of during a beam-on period of the blanking deflector 212. This is because if setting to be described later is performed by the preferably larger deflection amount (deflection voltage), the beam incident angle does not deviate by a voltage change amount less than the larger deflection amount. Specifically, the writing control unit 66 outputs a control signal to the control circuit 120. The control circuit 120 outputs the control signal to the coil control circuit 134 so that the current value may be a specified one. The coil control circuit 134 supplies the specified current to the magnet coil 216.

Alternatively, in the case of the example of FIG. 16, the DAC amplifier 123 applies, to the blanking deflector 212, a voltage for deflecting the electron beam 200 in the extent of deflection not to trigger a beam-off state from the beam-on state by the blanking deflector 212. It is preferable that this deflection amount is larger than that generated by a voltage change of during a beam-on period of the blanking deflector 212. This is because if setting to be described later is performed by the preferably larger deflection amount (deflection voltage), the beam incident angle does not deviate by a voltage change amount less than the larger deflection voltage. Specifically, the writing control unit 66 outputs a control signal to the control circuit 120. The control circuit 120 outputs the control signal to the DAC amplifier 123 so that the voltage value may be a specified one. The DAC amplifier 123 converts the digital signal to an analog signal to be amplified and applies the specified voltage as a deflection voltage to the blanking deflector 212.

In the beam center move step (S220), the center of the electron beam 200 is moved by deflecting the electron beam 200 toward the center of the objective lens 207 by using the magnet coil 218. It is desirable to adjust so that the center position of the electron beam 200 may be located at the center position of the magnetic field of the objective lens 207. Specifically, the writing control unit 66 outputs a control signal to the control circuit 120. The control circuit 120 outputs the control signal to the coil control circuit 133 so that the current value may be a specified one. The coil control circuit 133 supplies the specified current to the magnet coil 218. Here, first, a temporary current value is set.

In the objective lens setting (1) step (S222), the focus position of the electron beam 200 is set by the objective lens 207. The focus is, in this case, set at a height position different from that of the mark 106 height. As shown in FIG. 18, the focus position (focus 1) is adjusted to be upward (positive (+)) in the z direction) in this case.

In the irradiation position measuring step (S224), the measurement unit 70 irradiates the electron beam 200 onto the mark 106 (target object 101) in the state described above, and measures the irradiation position of the electron beam 200 irradiating the mark 106 (target object 101). Specifically, first, the XY stage 105 is moved so that the mark 106 on the XY stage 105 may be arranged at a designed irradiation position of the electron beam 200. In such a state, scanning is performed in the x and y directions on the mark 106 by irradiating the electron beam 200 and deflecting it in the x and y directions by the sub deflector 209, for example. Then, the detection device 220 detects (measures) a reflected electron or a secondary electron generated at the mark 106 and its circumference. The output of the detection device 220 is converted into a digital signal and amplified by the amplifier 138, and input into the control computer 110. In the control computer 110, the measurement unit 70 calculates an irradiation position of the beam based on a scanning result. The irradiation position of the beam is output outside through the external I/F circuit 112 and the like.

In the objective lens setting (2) step (S226), the focus position of the electron beam 200 is set at another height position by the objective lens 207. Here, also, the focus is set at a height position different from that of the mark 106. In this case, as shown in FIG. 18, the focus position (focus 2) is adjusted to be downward (negative (−) in the z direction), for example.

In the irradiation position measuring step (S228), the measurement unit 70 irradiates the electron beam 200 onto the mark 106 (target object 101) in the state described above, and measures the irradiation position of the electron beam 200 irradiating the mark 106 (target object 101). Specifically, scanning is performed in the x and y directions on the mark 106 by irradiating the electron beam 200 and deflecting it in the x and y directions by the sub deflector 209, for example. Then, the detection device 220 detects (measures) a reflected electron or a secondary electron generated at the mark 106 and its circumference. The output of the detection device 220 is converted into a digital signal and amplified by the amplifier 138, and input into the control computer 110. In the control computer 110, the measurement unit 70 calculates an irradiation position of the beam based on a scanning result. The irradiation position of the beam is output outside through the external I/F circuit 112 and the like.

In the determination step (S230), first, the positional deviation amount calculation unit 72 calculates a difference between the irradiation position on the mark 106 at the positive (+) side focus position indicated by the focus 1 and the irradiation position on the mark 106 at the negative (−) side focus position indicated by the focus 2. Then, the determination unit 74 determines whether the positional deviation amount between the measured irradiation positions is less than or equal to the threshold value Δ1 (first threshold value). If the positional deviation amount between the measured irradiation positions is not less than or equal to the threshold value Δ1, it returns to the beam center move step (S220), and repeats steps from the beam center move step (S220) to the determination step (S230) until the positional deviation amount becomes less than or equal to the threshold value Δ1. The closer the center position of the electron beam 200 approaches the center position of the magnetic field of the objective lens 207, the smaller the deviation amount between the measured irradiation positions becomes. That is, if the positional deviation amount between the measured irradiation positions is less than or equal to the threshold value Δ1, it means that the center position of the electron beam 200 has further approached the center position of the magnetic field of the objective lens 207. In other words, the center of the electron beam 200 is moved toward the center of the objective lens 207 by using the magnet coil 218 so that the positional deviation amount between the measured irradiation positions may be less than or equal to the threshold value Δ1.

In the determination step (S232), the determination unit 76 determines whether a difference (L1−L2) is less than or equal to a threshold value 2 (the second threshold value), where L1 is a movement amount of the center of the electron beam 200 in a beam-on state (the state after the beam-on setting step (S204)) and L2 is a movement amount of the center of the electron beam 200 in a further deflected state (the state after the blanking deflection adjustment step (S218)) changed from the beam-on state.

It is also preferable to obtain a movement amount L1 of the beam center in a beam-on state by converting an accumulated change amount of a current input to the magnet coil 218. In other words, what is used is the sum of moved distances of the beam center in the beam center move step (S206) that has been performed until a positional deviation amount between the measured irradiation positions becomes less than or equal to the threshold value Δ1 in the determination step (S216).

Similarly, it is also preferable to obtain a movement amount L2 of the beam center in a further deflected state changed from the beam-on state by converting an accumulated change amount of a current input to the magnet coil 218. In other words, what is used is the sum of moved distances of the beam center in the beam center move step (S220) that has been performed until a positional deviation amount between the measured irradiation positions becomes less than or equal to the threshold value Δ1 in the determination step (S230).

In the case where a difference (L1−L2) between the movement amounts L1 and L2 of the beam center is not less than or equal to the threshold value Δ2, it returns to the lens value temporary setting step (S202) and sets a next applied voltage to the electron lens 211. Then, steps from the lens value temporary setting step (S202) to the determination step (S232) are repeated until the difference (L1−L2) between the movement amounts L1 and L2 of the beam center becomes less than or equal to the threshold value L2. In other words, each step described above is repeated while varying a voltage applied to the electron lens 211 until the difference (L1−L2) becomes less than or equal to the threshold value Δ2.

If the crossover position is adjusted to be in the center height position of the blanking deflector 212 by the electron lens 211, since the deflection fulcrum and the crossover position are not displaced from each other as described above, the beam center does not deviate from the center of the objective lens 207 as shown in FIG. 4A even if a minute deflection is produced.

In the lens value setting step (S234), the lens value (voltage value) at the time of a difference (L1−L2) becoming less than or equal to the threshold value Δ2 is set to the electron lens 211. As described above, the voltage to be applied to the electron lens 211 is adjusted so that the difference (L1−L2) may be less than or equal to the threshold value Δ2. Specifically, the writing control unit 66 outputs a control signal to the control circuit 120. The control circuit 120 outputs the control signal to the lens control circuit 130 so that the voltage value may be a specified one. The lens control circuit 130 applies the specified voltage to the electron lens 211.

Thus, the crossover position of the electron beam 200 converged by the electron lens 211 is adjusted to be in the center height position H of the blanking deflector 212. Therefore, as explained with reference to FIGS. 3B and 5A, when the crossover position is set to be in the center height position of the blanking deflector 212, even if a blanking voltage change occurs, the electron beam 200 enters the surface of the target object 101 at an angle substantially equivalent to a perpendicular incidence. In other words, it is possible to make the beam incident angle θ be approximately 0°.

As described above, according to the fourth embodiment, it is possible to make a beam incident angle to the target object surface unchanged even when a blanking voltage changes during a beam-on period.

In the writing step (S236), similarly to the writing step (S122), a pattern is written on the target object 101 by using the electron beam 200 whose incident angle to the target object surface has been adjusted by the above-described method of adjusting a beam incident angle to the surface of the target object 101, while a blanking operation is being performed by the blanking deflector 212.

Embodiments have been explained referring to concrete examples as described above. However, the present invention is not limited to these specific examples. For example, the determination step (S114) to determine whether a positional deviation amount is less than or equal to an allowable value L according to the first or second embodiment may be carried out outside the apparatus, not in the writing apparatus 100. For example, determination may be carried out by the user and the like. Moreover, calculation of a positional deviation amount may also be performed outside the apparatus, not in the writing apparatus 100. For example, the calculation may be carried out by the user and the like.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus, method of adjusting a beam incident angle to the target object surface, and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:
1. A charged particle beam writing apparatus comprising:
an emission unit configured to emit a charged particle beam;
an electron lens configured to converge the charged particle beam;
a blanking deflector, arranged backward of the electron lens with respect to a direction of an optical axis, configured to deflect the charged particle beam in a case of performing a blanking control of switching between beam-on and beam-off;
a blanking aperture member, arranged backward of the blanking deflector with respect to the direction of the optical axis, configured to block the charged particle beam having been deflected to be in a beam-off state;
a magnet coil, in addition to the blanking deflector, configured to deflect the charged particle beam, said magnet coil provided separately from and surrounding the blanking deflector and arranged in a center height position of the blanking deflector, wherein the magnet coil deflects the charged particle beam so that a beam trajectory deflected by the magnet coil is to be the same as a beam trajectory deflected by the blanking deflector for which blanking deflection in the extent not to trigger a beam-off state is performed by the blanking deflector;
an amplifier configured to apply a deflection voltage to the blanking deflector; and a coil control unit configured to supply a current for a deflection to the magnet coil, the coil control unit provided separately from the amplifier.

2. The apparatus according to claim 1,
wherein the charged particle beam is deflected, while passing through the blanking deflector, by the magnet coil.

3. The apparatus according to claim 2,
wherein the charged particle beam having been deflected by the magnet coil is variably shaped to irradiate a target object.

* * * * *